(12) United States Patent
Rha et al.

(10) Patent No.: US 10,141,258 B2
(45) Date of Patent: Nov. 27, 2018

(54) SEMICONDUCTOR DEVICES HAVING STAGGERED AIR GAPS

(71) Applicant: Samsung Electronics Co., Ltd., Suwon-si, Gyeonggi-do (KR)

(72) Inventors: Sangho Rha, Seongnam-si (KR); Jongmin Baek, Suwon-si (KR); Wookyung You, Suwon-si (KR); Sanghoon Ahn, Goyang-si (KR); Naein Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/659,125

(22) Filed: Jul. 25, 2017

(65) Prior Publication Data

US 2017/0323850 A1    Nov. 9, 2017

Related U.S. Application Data

(63) Continuation of application No. 15/146,112, filed on May 4, 2016, now Pat. No. 9,748,170, which is a (Continued)

(30) Foreign Application Priority Data

Apr. 7, 2014    (KR) .......................... 10-2014-0041160

(51) Int. Cl.
*H01L 23/00*    (2006.01)
*H01L 23/522*    (2006.01)
(Continued)

(52) U.S. Cl.
CPC ...... *H01L 23/5226* (2013.01); *H01L 21/7682* (2013.01); *H01L 21/76802* (2013.01); (Continued)

(58) Field of Classification Search
CPC .................................................. H01L 23/5226
See application file for complete search history.

(56) References Cited

U.S. PATENT DOCUMENTS 6,162,723 A    12/2000  Tanaka
7,253,095 B2   8/2007   Lur et al.
(Continued)

FOREIGN PATENT DOCUMENTS

JP    2009-123776 A    6/2009
JP    2009-194286 A    8/2009
(Continued)

*Primary Examiner* — William Harriston
(74) *Attorney, Agent, or Firm* — Ward and Smith, P.A.

(57) ABSTRACT

A semiconductor device includes a substrate, a plurality of first conductive patterns disposed on the substrate and a plurality of second conductive patterns disposed on the first conductive patterns. Respective air gaps are disposed between adjacent ones of the first conductive patterns overlying a first region of the substrate, while adjacent ones of the first conductive patterns overlying a second region of the substrate do not have air gaps disposed therebetween. The air gaps may include first air gaps, and the device may further include second air gaps disposed between adjacent ones of the second conductive patterns in the second region. Adjacent ones of the second conductive patterns overlying a second region of the substrate may not have air gaps disposed therebetween.

11 Claims, 25 Drawing Sheets

Related U.S. Application Data continuation of application No. 14/679,786, filed on Apr. 6, 2015, now Pat. No. 9,343,409.

(51) Int. Cl.
  *H01L 23/532* (2006.01)
  *H01L 23/528* (2006.01)
  *H01L 21/768* (2006.01)
  *H01L 21/764* (2006.01)

(52) U.S. Cl.
  CPC .. *H01L 21/76843* (2013.01); *H01L 21/76877* (2013.01); *H01L 23/528* (2013.01); *H01L 23/5222* (2013.01); *H01L 23/5329* (2013.01); *H01L 23/53223* (2013.01); *H01L 23/53266* (2013.01); *H01L 23/53295* (2013.01); *H01L 21/764* (2013.01); *H01L 21/76816* (2013.01); *H01L 21/76837* (2013.01); *H01L 2924/00* (2013.01); *H01L 2924/0002* (2013.01)

(56) References Cited

U.S. PATENT DOCUMENTS

| | | |
|---|---|---|
| 8,034,693 B2 | 10/2011 | Shibata et al. |
| 8,642,252 B2 | 2/2014 | Clevenger et al. |
| 2002/0005584 A1 | 1/2002 | Domae |
| 2004/0094821 A1 | 5/2004 | Lur et al. |
| 2004/0097065 A1 | 5/2004 | Lur et al. |
| 2008/0299758 A1 | 12/2008 | Harada et al. |
| 2008/0299763 A1 | 12/2008 | Ueki et al. |
| 2008/0299779 A1* | 12/2008 | Smith ................. H01L 21/7682 438/759 |
| 2009/0302475 A1* | 12/2009 | Korogi ............... H01L 21/7682 257/761 |
| 2010/0130001 A1* | 5/2010 | Noguchi ........... H01L 21/76811 438/627 |
| 2010/0301489 A1* | 12/2010 | Seidel ............... H01L 21/76804 257/773 |
| 2015/0137378 A1* | 5/2015 | Wu ...................... H01L 23/5222 257/773 |

FOREIGN PATENT DOCUMENTS

| | | |
|---|---|---|
| JP | 2009-295733 A | 12/2009 |
| KR | 10-2000-0043902 A | 7/2000 |
| KR | 10-2004-0049969 A | 6/2004 |
| KR | 10-2008-0010823 A | 1/2008 |
| KR | 10-2012-0074014 A | 7/2012 |

* cited by examiner

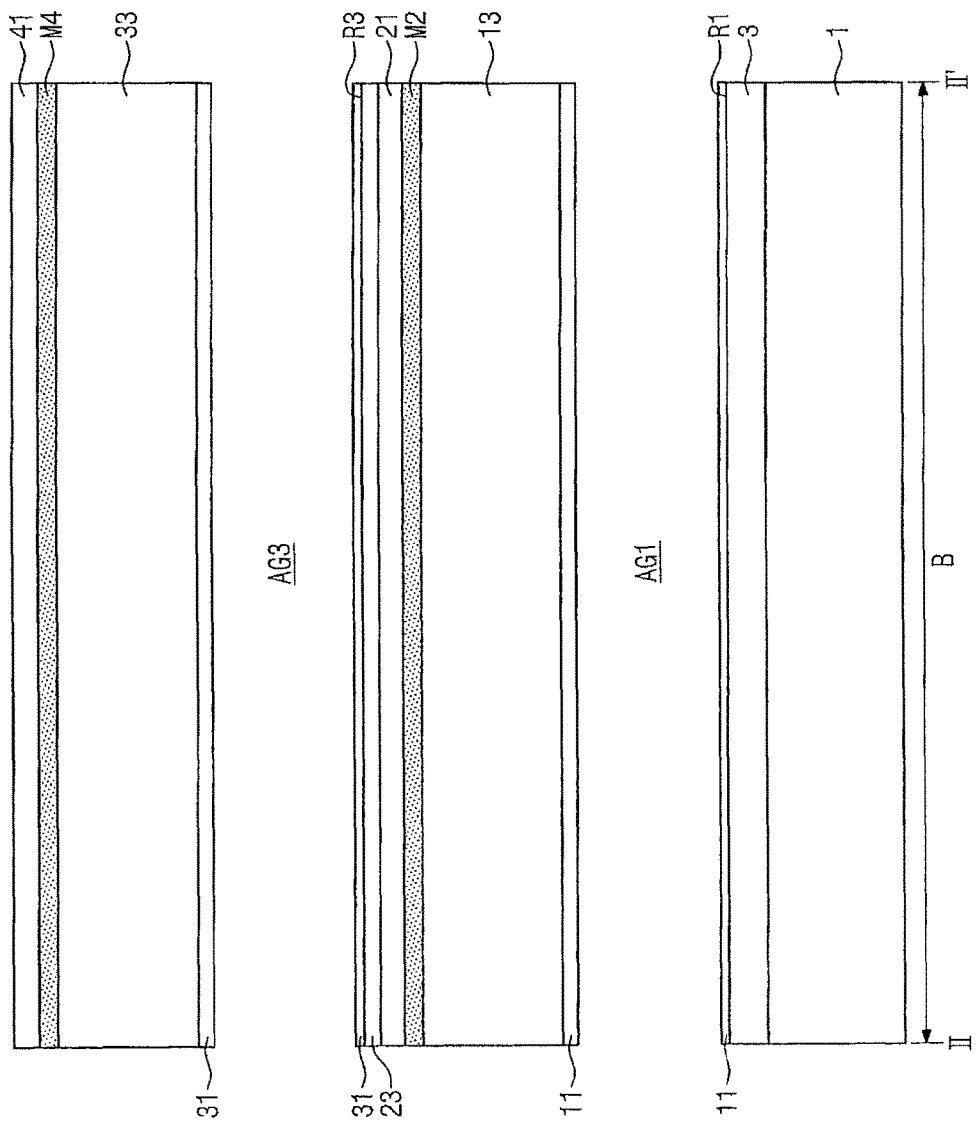

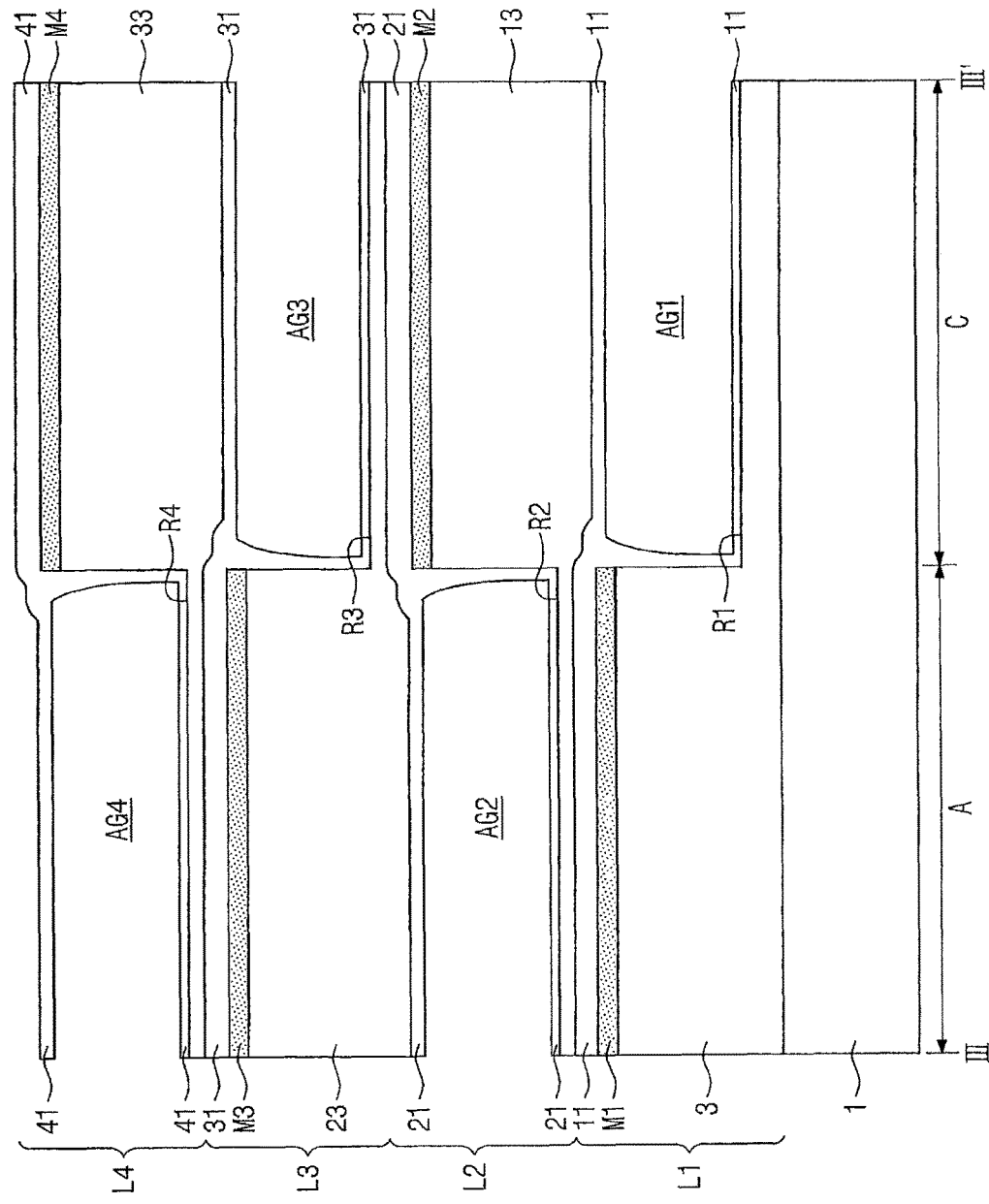

SEMICONDUCTOR DEVICES HAVING STAGGERED AIR GAPS

CROSS-REFERENCE TO RELATED APPLICATIONS

This application is a continuation of U.S. patent application Ser. No. 15/146,112, filed May 4, 2016, which is a continuation of U.S. patent application Ser. No. 14/679,786, filed Apr. 6, 2015 which claims priority to Korean Patent Application No. 10-2014-0041160 filed on Apr. 7, 2014 in the Korean Intellectual Property Office (KIPO), the contents of each are herein incorporated by reference in their entireties.

TECHNICAL FIELD

The present inventive concepts relate to semiconductor devices and, more particular, semiconductor devices including air gaps.

DESCRIPTION OF RELATED ART

It is desirable for semiconductor devices to be highly integrated, dense, with low power consumption, high speed, and other performance characteristics. Some highly integrated semiconductor devices include multiple interconnection layers, each including a plurality of conductive patterns. As feature sizes of semiconductor devices have decreased, distances between adjacent conductive patterns have been narrowed. Because of the reduced separation, interference between the adjacent conductive patterns may be generated by parasitic capacitance, which may negatively impact data transfer. Therefore, various techniques have been proposed to reduce parasitic capacitance between adjacent conductive patterns.

Some of these techniques involve the use of air gaps to reduce capacitive coupling between conductors. Such techniques are described, for example, in U.S. Pat. No. 7,253,095 to Lur et al., U.S. Pat. No. 8,034,693 to Shibata et al, and U.S. Pat. No. 8,642,252 to Clevenger et al.

SUMMARY

According to some embodiments, a semiconductor device includes a substrate, a plurality of first conductive patterns disposed on the substrate, and a plurality of second conductive patterns disposed on the first conductive patterns. Respective air gaps are disposed between adjacent ones of the first conductive patterns overlying a first region of the substrate, while adjacent ones of the first conductive patterns overlying a second region of the substrate do not have air gaps disposed therebetween. The air gaps may include first air gaps, and the device may further include second air gaps disposed between adjacent ones of the second conductive patterns overlying the second region of the substrate. Adjacent ones of the second conductive patterns overlying the first region of the substrate may not have air gaps disposed therebetween.

The first and second conductive patterns may be conductive lines extending along the same direction. The first and second conductive patterns may include conductive lines extending along a first direction and the first region of the substrate may be adjacent the second region along a second direction transverse to the first direction.

In some embodiments, the second air gaps do not overlie the first air gaps.

In further embodiments, the semiconductor device may further include an interlayer dielectric layer between the first conductive patterns in the second region and a mask pattern on the interlayer dielectric layer.

In some embodiments, the first conductive patterns may include a plurality of conductive plugs vertically overlapped by the mask pattern. Sidewalls of the conductive plugs may contact the interlayer dielectric layer.

In some embodiments, the mask pattern overlies the second region of the substrate but does not overlie the first region of the substrate. The mask pattern may have a mechanical strength greater than that of the interlayer dielectric layer.

According to further embodiments, the semiconductor device further includes third conductive patterns on the second conductive patterns. Respective third air gaps are disposed between adjacent ones of the third conductive patterns and overlying the first region of the substrate, wherein adjacent ones of the third conductive patterns overlying the second region of the substrate do not have air gaps disposed therebetween.

According to further embodiments, the device may further include a second interlayer dielectric layer between the second conductive patterns in the first region and a second mask pattern on the second interlayer dielectric layer. The second mask pattern may overlie the first region of the substrate but not overlie the second region of the substrate. The second mask pattern may overlap the first mask pattern.

The semiconductor device may further include a first metal oxynitride layer disposed between the first mask pattern and the first interlayer dielectric layer and a second metal oxynitride layer disposed between the second mask pattern and the second interlayer dielectric layer.

Further embodiments provide a semiconductor device including a substrate and a plurality of first conductive patterns disposed on the substrate. Respective first air gaps are disposed between adjacent ones of the first conductive patterns overlying a first region of the substrate. The device further includes a plurality of second conductive patterns disposed on the first conductive patterns. Respective second air gaps are disposed between adjacent ones of the second conductive patterns overlying a second region of the substrate. Adjacent ones of the first conductive patterns overlying the second region of the substrate do not have air gaps disposed therebetween and adjacent ones of the second conductive patterns overlying the first region of the substrate do not have air gaps disposed therebetween.

The device may further include a first interlayer dielectric layer disposed between the first conductive patterns overlying the second region of the substrate and a second interlayer dielectric layer disposed between the second conductive patterns overlying the first region of the substrate. The device may also include a first mask pattern disposed on the first interlayer dielectric layer overlying the second region of the substrate. The device may further include a second mask pattern disposed on the second interlayer dielectric layer overlying the first region of the substrate and a plurality of third conductive patterns disposed on the second mask pattern.

Further embodiments provide a semiconductor device including a substrate and a plurality of first conductive patterns disposed on the substrate. Respective first air gaps are disposed between adjacent ones of the plurality of first conductive patterns overlying a first region of the substrate. The device further includes a plurality of second conductive patterns disposed on the first conductive patterns. Respective second air gaps are disposed between adjacent ones of the plurality of second conductive patterns overlying a second region of the substrate. A mask pattern is disposed between the first conductive patterns and the second conductive patterns and not overlapping the first air gaps.

Still further embodiments provide a semiconductor device including a substrate, an interlayer dielectric layer disposed on the substrate, first conductive lines disposed in the interlayer dielectric layer and second conductive lines disposed in a recess in the interlayer dielectric layer. The device further includes a diffusion barrier layer disposed on and between adjacent ones of the second conductive lines in the recess in the interlayer dielectric layer. The diffusion barrier layer defines respective air gaps between sidewalls of adjacent ones of the second conductive lines. The diffusion barrier layer may also overlie the first conductive lines and the device may further include a strengthening layer interposed between the interlayer dielectric layer and the diffusion barrier layer and overlying the first conductive lines. The strengthening layer may not overlie the second conductive lines.

According to further embodiments, the interlayer dielectric layer comprises a first interlayer dielectric layer, the diffusion barrier layer comprises a first diffusion barrier layer, the air gaps comprise first air gaps, and the device further includes a second interlayer dielectric layer on the first barrier diffusion layer, third conductive lines disposed in the interlayer dielectric layer overlying the second conductive lines, fourth conductive lines disposed in a recess in the second interlayer dielectric layer overlying the first conductive lines and a second diffusion barrier layer disposed on and between adjacent ones of the fourth conductive lines in the recess in the second interlayer dielectric layer. The second diffusion barrier layer defines respective second air gaps between sidewalls of adjacent ones of the fourth conductive lines. The first diffusion barrier layer may also overlie the first conductive lines and the device may further include a first strengthening layer interposed between the first interlayer dielectric layer and the first diffusion barrier layer and overlying the first conductive lines. The second diffusion barrier may also overlie the third conductive lines and the device may further include a second strengthening layer interposed between the second interlayer dielectric layer and the second diffusion barrier layer and overlying the third conductive lines.

BRIEF DESCRIPTION OF THE DRAWINGS

These and other features of the inventive concept will become more apparent by describing in detail exemplary embodiments thereof with reference to the accompanying drawings of which:

FIG. 2B is a cross-sectional view corresponding to line II-II' of FIG. 1.

FIG. 15c is a cross-sectional view corresponding to line III-III' of FIG. 14.

DETAILED DESCRIPTION

Figure 1:
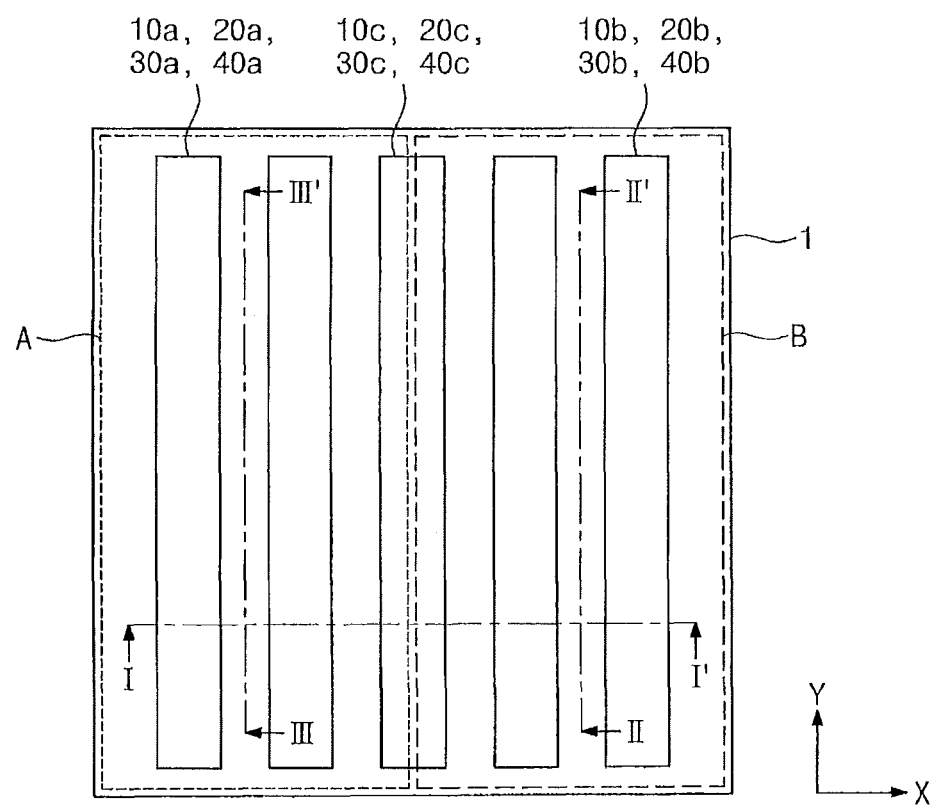
FIG. 1 is a plan view illustrating semiconductor devices according to some embodiments of the inventive concepts.

Exemplary embodiments of the inventive concepts will now be described more fully hereinafter with reference to the accompanying drawings; however, they may be embodied in different forms and should not be construed as limited to the exemplary embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the figures, the dimensions of layers and regions may be exaggerated for clarity of illustration.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, exemplary embodiments of the inventive concepts will be described in detail with reference to the accompanying drawings.

Figure 2A:
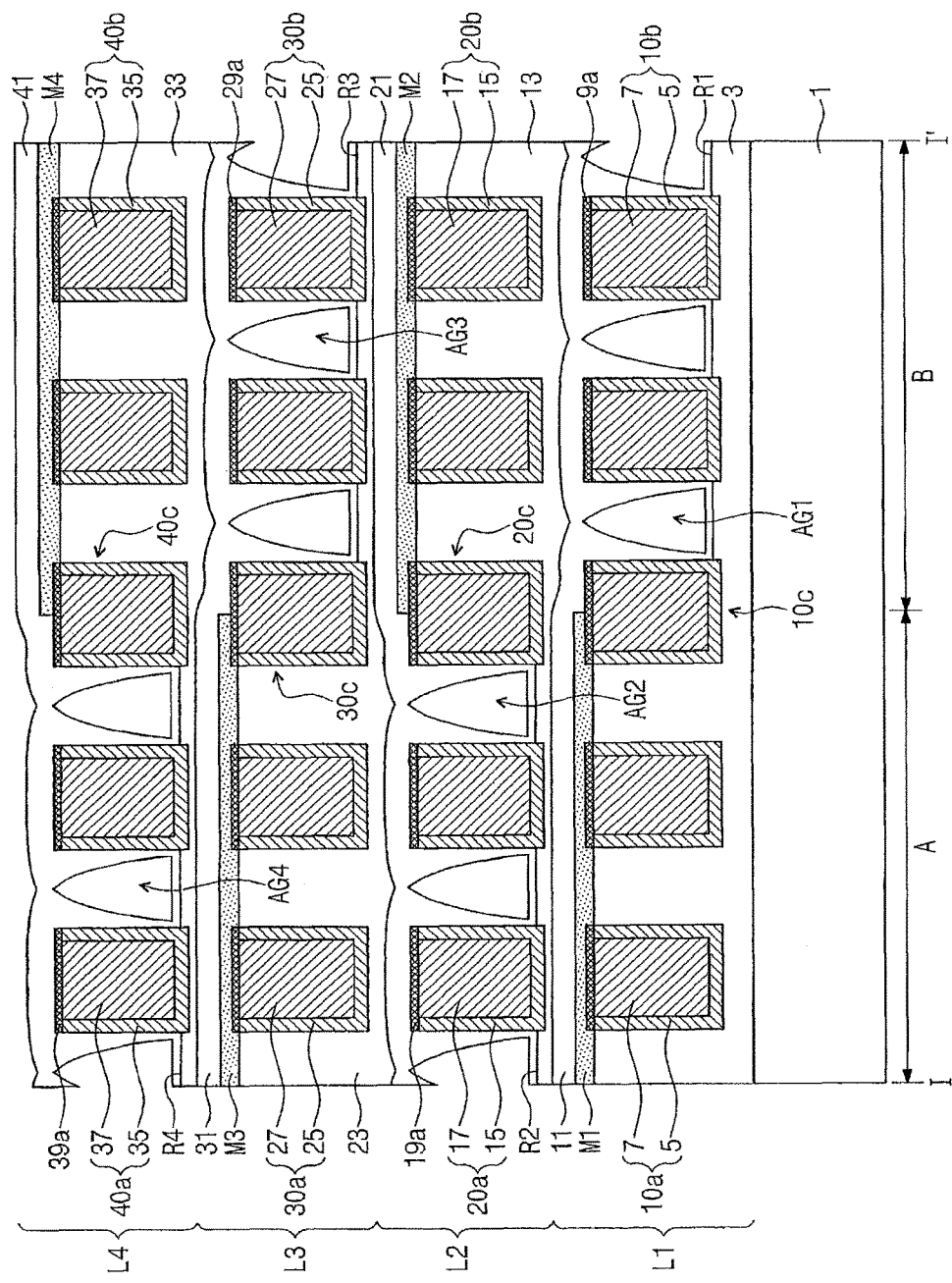
FIG. 2A is a cross-sectional view corresponding to line I-I' of FIG. 1.
Figure 2C:
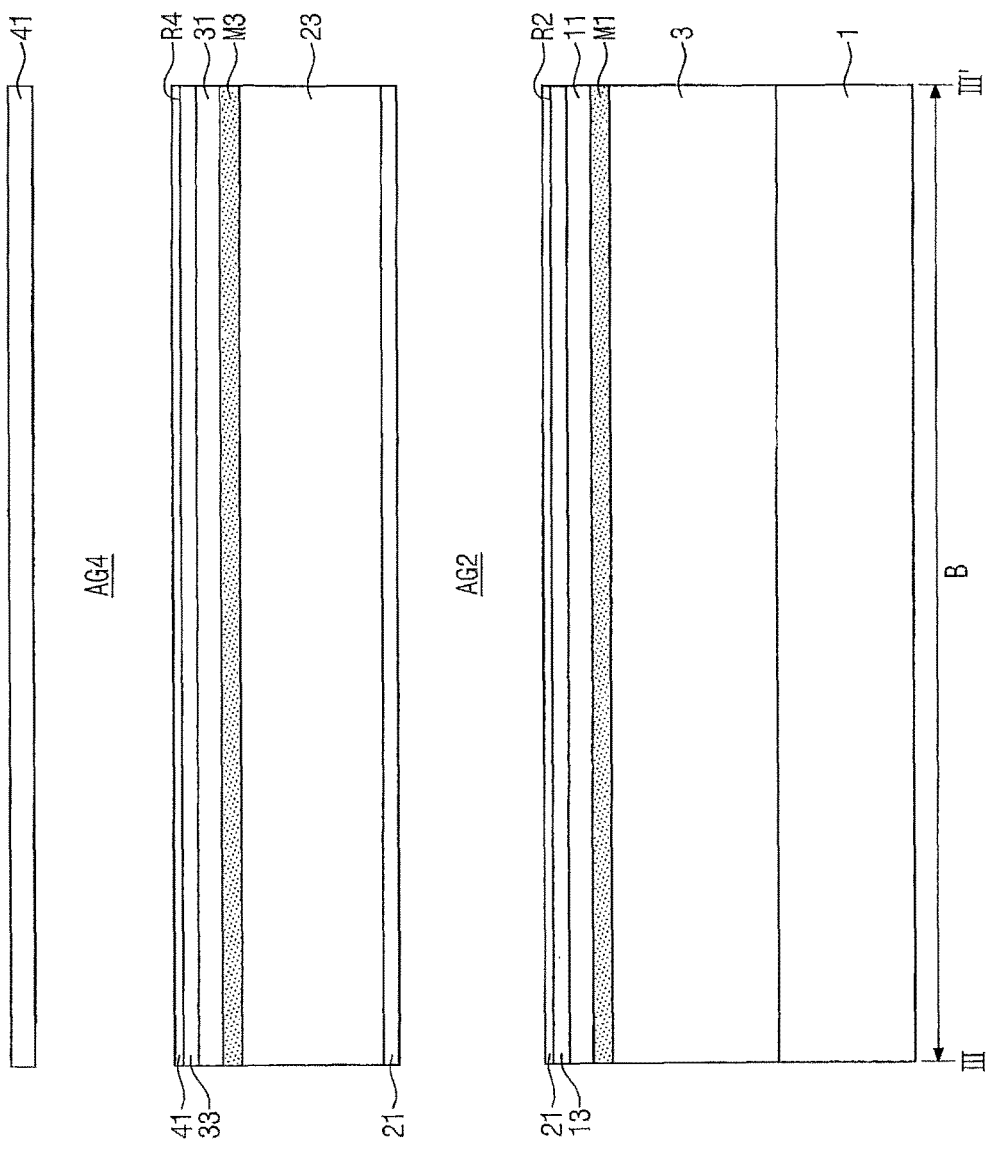
FIG. 2C is a cross-sectional view corresponding to line III-III' of FIG. 1.

FIG. 1 is a plan view illustrating a semiconductor device according to an exemplary embodiment of the inventive concepts. FIGS. 2a, 2b and 2c are cross-sectional views corresponding to lines I-I', II-II' and of FIG. 1, respectively.

Referring to FIGS. 1 and 2a through 2c, a semiconductor substrate 1 may include a first region A and a second region B. The first region A may be disposed at a left side and the second region B may be disposed a right side. The substrate 1 may include a device isolation layer and/or transistors. A first interconnection layer L1, a second interconnection layer L2, a third interconnection layer L3, and a fourth interconnection layer L4 may be sequentially stacked on the substrate 1.

The first interconnection layer L1 may include a first interlayer dielectric layer 3, a plurality of eleventh conductive patterns 10a, a plurality of twelfth conductive patterns 10b, a thirteenth conductive pattern 10c, and a plurality of first air gaps AG1. The first interlayer dielectric layer 3 may include a silicon oxide layer having a lower dielectric constant, for example, a SiOCH layer and/or a porous-SiOCH layer. A first recess R1 may be formed in the first interlayer dielectric layer 3 disposed in the second region B. The eleventh conductive patterns 10a may be formed in the first region A and the twelfth conductive patterns 10b may be formed in the second region B. The thirteenth conductive pattern 10c may be formed at a boundary of the first region A and the second region B. A portion of the thirteenth conductive pattern 10c and the twelfth conductive patterns 10b are disposed in the first recess R1. Another portion of the thirteenth conductive pattern 10c and sidewalls of the eleventh conductive patterns 10a may be covered by the first interlayer dielectric layer 3. The eleventh through thirteenth conductive patterns 10a through 10c may be line patterns formed in parallel and may extend along a direction, for example, Y-direction.

Each of the eleventh through thirteen conductive patterns 10a, 10b, and 10c may include a first wiring line 7 and a first metal diffusion barrier layer 5 that covers a bottom and sidewalls of the first wiring line 7. The first wiring line 7 may be formed of a metal material, for example, aluminum (Al) and/or tungsten (W). The first metal diffusion barrier layer 5 may include at least one of titanium (Ti), titanium nitride (TiN), tantalum (Ta), tantalum nitride (TaN), ruthenium (Ru), cobalt (Co), manganese (Mn), tungsten nitride (WN), nickel (Ni) or nickel boron (NiB). A first capping layer 9a may be formed on the eleventh through thirteen conductive patterns 10a, 10b, and 10c. The first capping layer 9a may be formed of a metal nitride including at least one of tantalum (Ta), ruthenium (Ru), cobalt (Co), manganese (Mn), titanium (Ti), tungsten (W), nickel (Ni), aluminum (Al) or a mixture thereof.

In the first region A, upper surfaces of the eleventh conductive patterns 10a, a portion of an upper surface of the thirteenth conductive pattern 10c, and an upper surface of the first interlayer dielectric layer 3 may be covered by a first mask pattern M1. The first mask pattern M1 may include at least one of silicon carbon nitride (SiCN), silicon nitride (SiN), or silicon oxycarbide (SiOC). The first mask pattern M1 may have a mechanical strength greater than that of the first interlayer dielectric layer 3. An upper surface of the first mask pattern M1 may be covered by a first insulating diffusion barrier layer 11. The first insulating diffusion barrier layer 11 may include at least one of silicon carbon nitride (SiCN), silicon nitride (SiN), or silicon oxycarbide (SiOC). The first insulating diffusion barrier layer 11 may extend to the second region B and cover the upper surfaces and both sidewalls of the twelfth conductive patterns 10b and a sidewall of the thirteenth conductive pattern 10c. In the second region B, the first insulating diffusion barrier layer 11 may define the first air gaps AG1 between adjacent ones of the twelfth conductive patterns 10b.

Next, the second interconnection layer L2 will be explained in detail. The second interconnection layer L2 may be formed on the first interconnection layer L1 and have a similar structure. However, a plurality of air gaps may be formed in a different side, i.e., the second region B, in the second interconnection layer L2.

The second interconnection layer L2 may include a second interlayer dielectric layer 13. A second recess R2 may be formed in the second interlayer dielectric layer 13 in the first region A. A plurality of twenty-first conductive patterns 20a may be formed in the second recess R2. In the second region B, a plurality of twenty-second conductive patterns 20b may be formed in the second interlayer dielectric layer 13. A twenty-third conductive pattern 20c may be formed at a boundary of the first region A and the second region B. Each of the twenty-first through twenty-third conductive patterns 20a, 20b, and 20c may include a second wiring line 17 and a second metal diffusion barrier layer 15. Upper surfaces of the twenty-first through twenty-third conductive patterns 20a, 20b, and 20c may be covered by a second capping layer 19a. In the second region B, upper surfaces of the twenty-second conductive patterns 20b and a portion of the twenty-third conductive pattern 20c may be covered by a second mask pattern M2. A second insulating diffusion barrier layer 21 may be formed on the second mask pattern M2. The second insulating diffusion barrier layer 21 may cover upper surfaces of the twenty-first conductive patterns 20a and sidewalls thereof. Second air gaps AG2 may be formed between adjacent ones of the twenty-first conductive patterns 20a.

A third interconnection layer L3 may be formed on the second interconnection layer L2 and may have substantially the same structure as the first interconnection layer L1.

The third interconnection layer L3 may include a third interlayer dielectric layer 23. A third recess R3 may be formed in the third interlayer dielectric layer 23 in the second region B. A plurality of thirty-first conductive patterns 30a may be formed in the third interlayer dielectric layer 23 and a plurality of thirty-second conductive patterns 30b may be formed in the third recess R3. A thirty-third conductive pattern 30c may be formed at a boundary of the first region A and second region B. Each of the thirty-first through thirty-third conductive patterns 30a, 30b, and 30c may include a third wiring line 27 and a third metal diffusion barrier layer 25. Upper surfaces of the thirty-first through thirty-third conductive patterns 30a, 30b, and 30c may be covered by a third capping layer 29a. In the first region A, upper surfaces of the thirty-first conductive patterns 30a and a portion of the thirty-third conductive pattern 30c may be covered by a third mask pattern M3. A third insulating diffusion barrier layer 31 may be formed on the third mask pattern M3. The third insulating diffusion barrier layer 31 may cover upper surfaces of the thirty-second conductive patterns 30b and sidewalls thereof. Third air gaps AG3 may be formed at between adjacent ones of the thirty-second conductive patterns 30b.

A fourth interconnection layer L4 may be formed on the third interconnection layer L3 and may have substantially the same structure as the second interconnection layer L2.

The fourth interconnection layer L4 may include a fourth interlayer dielectric layer 33. A fourth recess R4 may be formed in the fourth interlayer dielectric layer 33 in the first region A. A plurality of forty-first conductive patterns 40a may be formed in the fourth recess R4. In the second region B, a plurality of forty-second conductive patterns 40b may be formed in the fourth interlayer dielectric layer 33. A forty-third conductive pattern 40c may be formed at a boundary of the first region A and the second region B. Each of the forty-first through forty-third conductive patterns 40a, 40b, and 40c may include a fourth wiring line 37 and a fourth metal diffusion barrier layer 35. Upper surfaces of the forty-first through forty-third conductive patterns 40a, 40b, and 40c may be covered by a fourth capping layer 39a. In the second region B, upper surfaces of the forth-second conductive patterns 40b and a portion of the forty-third conductive pattern 40c may be covered by a fourth mask pattern M4. A fourth insulating diffusion barrier layer 41 may be formed on the fourth mask pattern M4. The fourth insulating diffusion barrier layer 41 may extend to cover upper surfaces of the forty-first conductive patterns 40a and sidewalls thereof Fourth air gaps AG4 may be formed at between adjacent ones of the forty-first conductive patterns 40a.

The eleventh, twenty-first, thirty-first, and forty-first conductive patterns 10a, 20a, 30a, and 40a may vertically overlap. The twelfth through forty-second conductive patterns 10b, 20b, 30b, and 40b may vertical overlap. The thirteenth through forty-third conductive patterns 10c, 20c, 30c, and 40c may vertically overlap.

The first air gaps AG1 are arranged so that they are not vertically overlapped by the second air gaps AG2. Instead, the first air gaps AG1 may be overlapped by the second interlayer dielectric layer 13 and the second mask pattern M2. The first mask pattern M1 and the first interlayer dielectric layer 3 may be disposed below the second air gaps AG2.

The second air gaps AG2 are arranged so that they are not vertically overlapped by the third air gaps AG3. Instead, the second air gaps AG2 may be vertically overlapped by the third interlayer dielectric layer 23 and the third mask pattern M3. The second mask pattern M2 and the second interlayer dielectric layer 13 may be disposed below the third air gaps AG3.

The third air gaps AG3 are arranged such that they are not vertically overlapped by the fourth air gaps AG4. The third air gaps AG3 may be vertically overlapped by the fourth interlayer dielectric layer 33 and the fourth mask pattern M4. The third mask pattern M3 and the third interlayer dielectric layer 23 may be disposed below the fourth air gaps AG4.

Mechanical strength and reliability of semiconductor devices manufactured according to some embodiments of the inventive concepts may be increased by forming the non-overlapped air gaps AG1 through AG4 in the stacked interconnection layers. Furthermore, mechanical strength of semiconductor devices may be further increased by the mask patterns M1 through M2. The thirteenth through forty-third conductive patterns 10c through 40c may help to increase the mechanical strength of the semiconductor device. Signal transfer rate of the semiconductor device manufactured according to some embodiments of the inventive concepts may be increased by the presence of the air gaps AG1 through AG4, which may decrease parasitic capacitance between the conductive patterns in each of the interconnection layers L1 through L4.

Various methods of manufacturing the semiconductor device according to exemplary embodiments of the inventive concepts will now be described.

FIGS. 3 through 11 are cross-sectional views illustrating a method of manufacturing a semiconductor device according to an exemplary embodiment of the inventive concepts corresponding to FIG. 2A.

Figure 3:
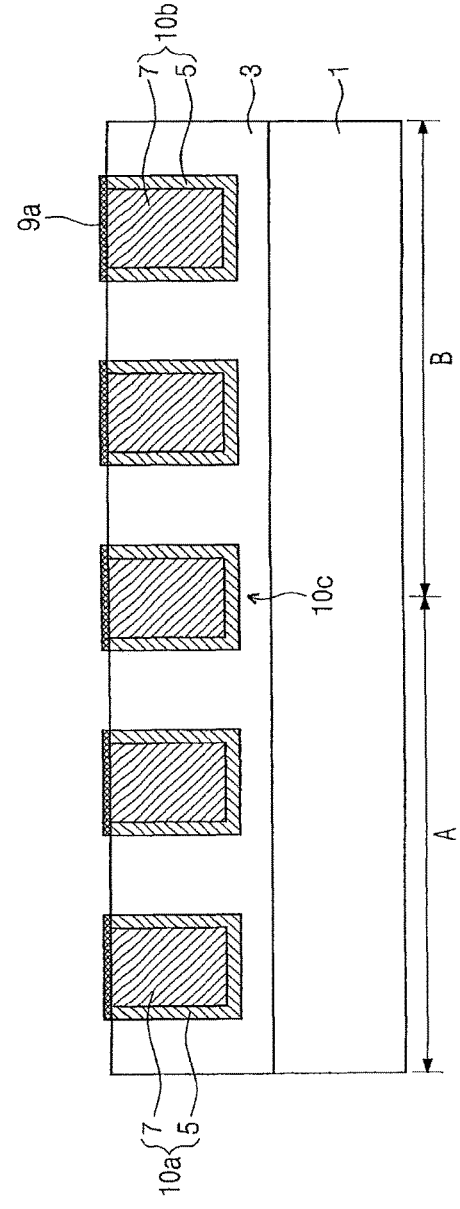
FIGS. 3 through 11 are cross-sectional views illustrating operations for fabricating semiconductor devices according to some embodiments of the inventive concepts.

Referring to FIG. 3, a substrate 1 having a first region A and a second region B may be provided. A first interlayer dielectric layer 3 may be formed on the substrate 1. A plurality of line-type grooves may be formed in the first interlayer dielectric layer 3 by patterning the first interlayer dielectric layer 3. A first metal diffusion barrier layer 5 may be conformally formed in the line-type grooves and a conductive layer may be formed on the first metal diffusion barrier layer 5 in order to fill the line-type grooves. A planarization process may be performed to the conductive layer and the first metal diffusion barrier layer 5 to expose an upper surface of the first interlayer dielectric layer 3 and to form eleventh through thirteenth conductive patterns 10a, 10b, and 10c in the line-type grooves. A first capping layer 9a may be formed on each of the eleventh through thirteenth conductive patterns 10a, 10b, and 10c. The first capping layer 9a may be formed by using a deposition process, for example, a chemical vapor deposition process or an atomic layer deposition process. The first capping layer 9a may be formed by using, for example, an electroplating process. The first capping layer 9a may include, for example, cobalt (Co). The first capping layer 9a may be absent from the upper surface of the first interlayer dielectric layer 3.

Figure 4:
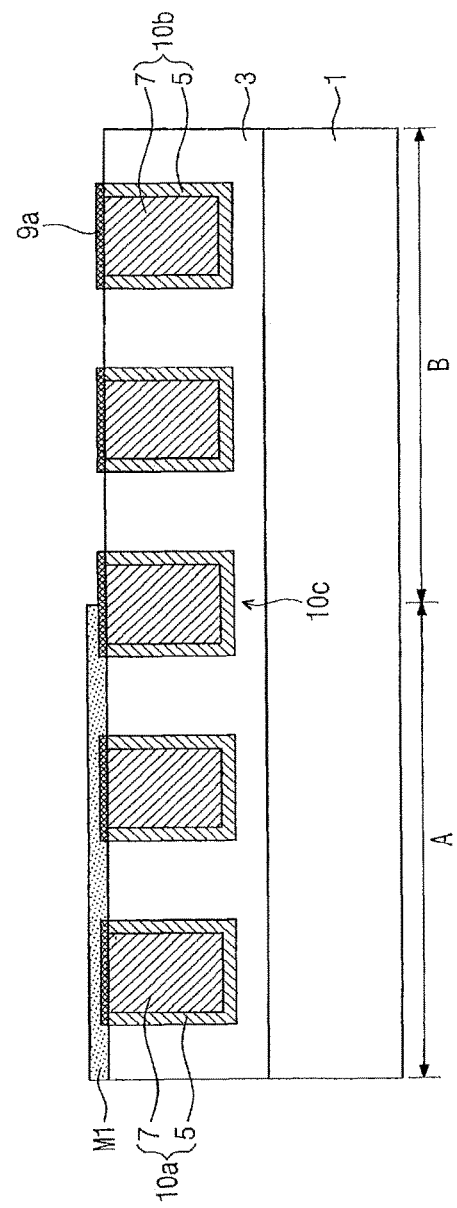

Referring to FIG. 4, a first mask pattern M1 may be formed on the first interlayer dielectric layer 3 disposed in the first region A, leaving an upper surface of the first interlayer dielectric layer 3 disposed in the second region B exposed. The first mask pattern M1 may be formed by patterning a mask layer after forming the mask layer entirely on the first interlayer dielectric layer 3. The first mask pattern M1 may include at least one of silicon carbon nitride (SiCN), silicon nitride (SiN), or silicon oxycarbide (SiOC).

Figure 5:
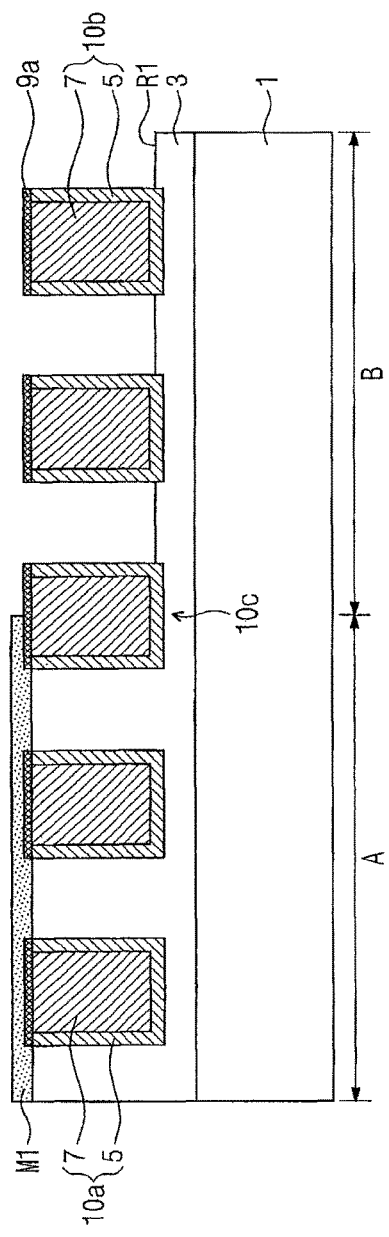

Referring to FIG. 5, a first recess R1 may be formed in the second region B by etching the first interlayer dielectric layer 3 using the first mask pattern M1 as an etch mask. Sidewalls of the twelfth conductive patterns 10b and a sidewall of the thirteenth conductive pattern 10c may be exposed in forming the first recess R1. The first capping layer 9a may protect the twelfth conductive patterns 10b and the thirteenth conductive pattern 10c from being damaged by an etch source gas when the first recess R1 is formed using an etch process.

Figure 6:
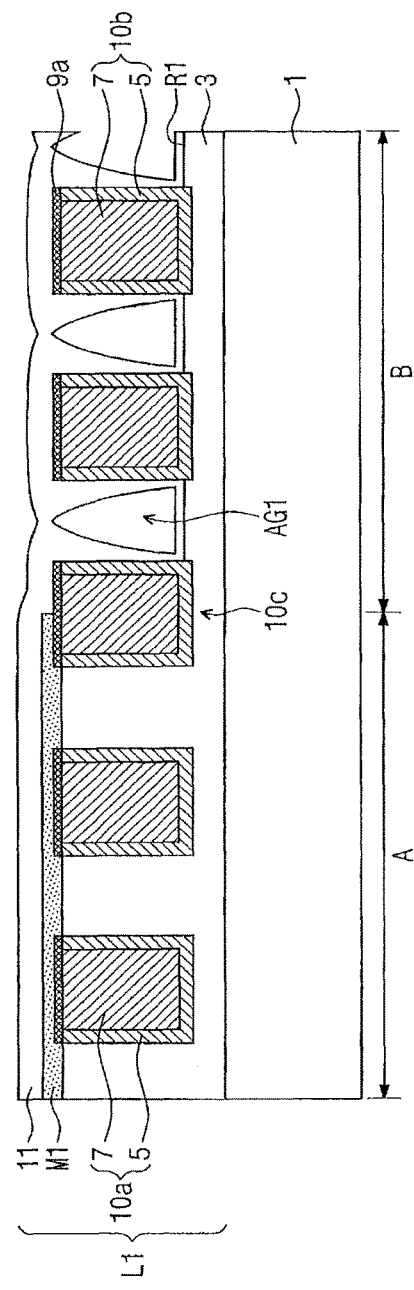

Referring to FIG. 6, a first insulating diffusion barrier layer 11 may be formed on the upper surface of the substrate 1. The first insulating diffusion barrier layer 11 may be formed by using a deposition method having a poor step coverage characteristic, e.g., a sputtering process or a physical vapor deposition process. Therefore, first air gaps AG1 may be formed between adjacent ones of the twelfth conductive patterns 10b even though the first insulating diffusion barrier layer 11 may have a uniform thickness on the first mask pattern M1. One of the first air gaps AG1 may be formed between the thirteenth conductive pattern 10c and an adjacent one of the twelfth conductive patterns 10b. A first interconnection layer L1 may comprise the first interlayer dielectric layer 3, the eleventh conductive patterns 10a, the twelfth conductive patterns 10b, the thirteenth conductive pattern 10c, the first mask pattern M1, and the first air gaps AG1.

Figure 7:
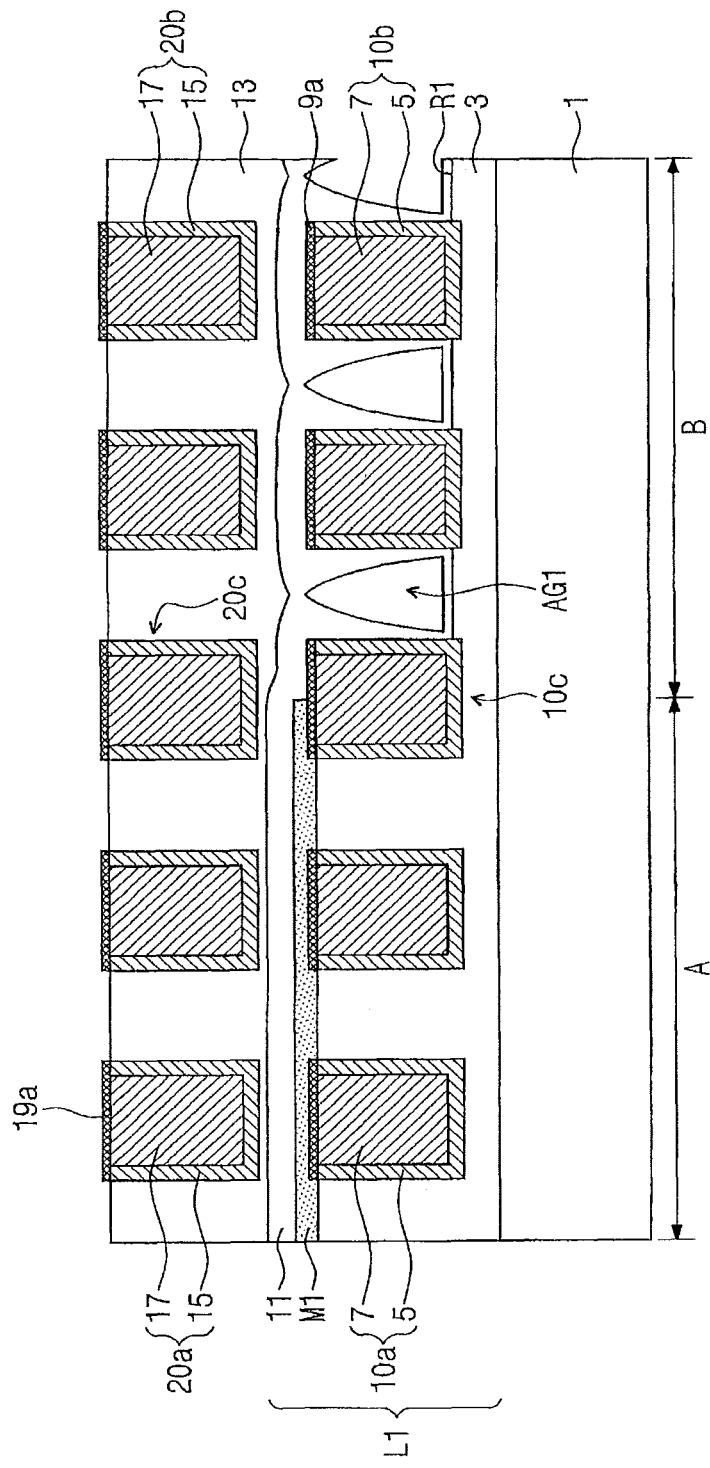

Referring to FIG. 7, a second interlayer dielectric layer 13 may be formed on the first interconnection layer L1. Twenty-first, twenty-second, and twenty-third conductive patterns 20a, 20b, and 20c may be formed in the second interlayer dielectric layer 13. A second capping layer 19a may be formed on the twenty-first through twenty-third conductive patterns 20a through 20c.

Figure 8:
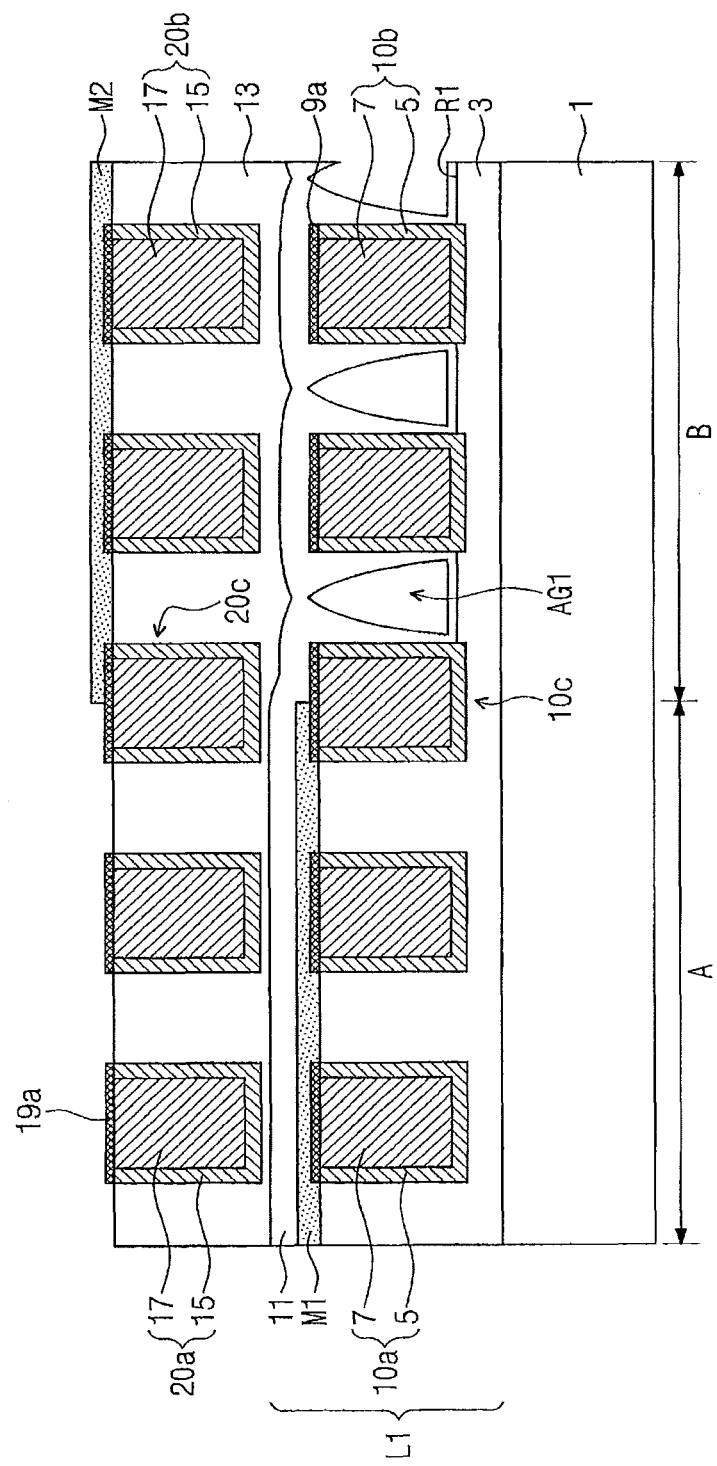
Figure 9:
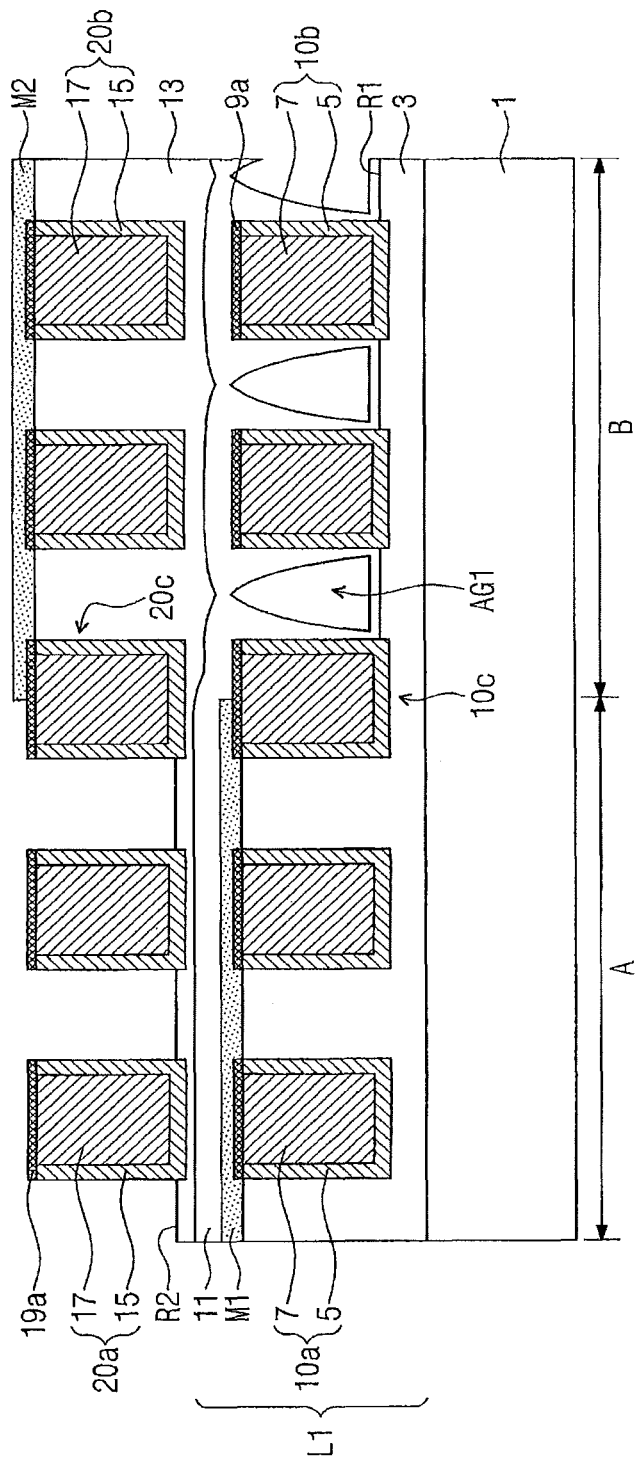

Referring to FIG. 8, a second mask pattern M2 may be formed that covers the second interlayer dielectric layer 13 in the second region B and exposes the second interlayer dielectric layer 13 in the first region A. Referring to FIG. 9, a second recess R2 may be formed in the first region A by etching the second interlayer dielectric layer 13 using the second mask pattern M2 as an etch mask. Sidewalls of the twenty-first conductive patterns 20a and a sidewall of the twenty-third conductive pattern 20c may be exposed in forming the second recess R2. The second capping layer 19a may protect the twenty-first conductive patterns 20a and the twenty-third conductive pattern 20c from being damaged by an etch source gas when the second recess R2 is formed using an etch process.

Figure 10:
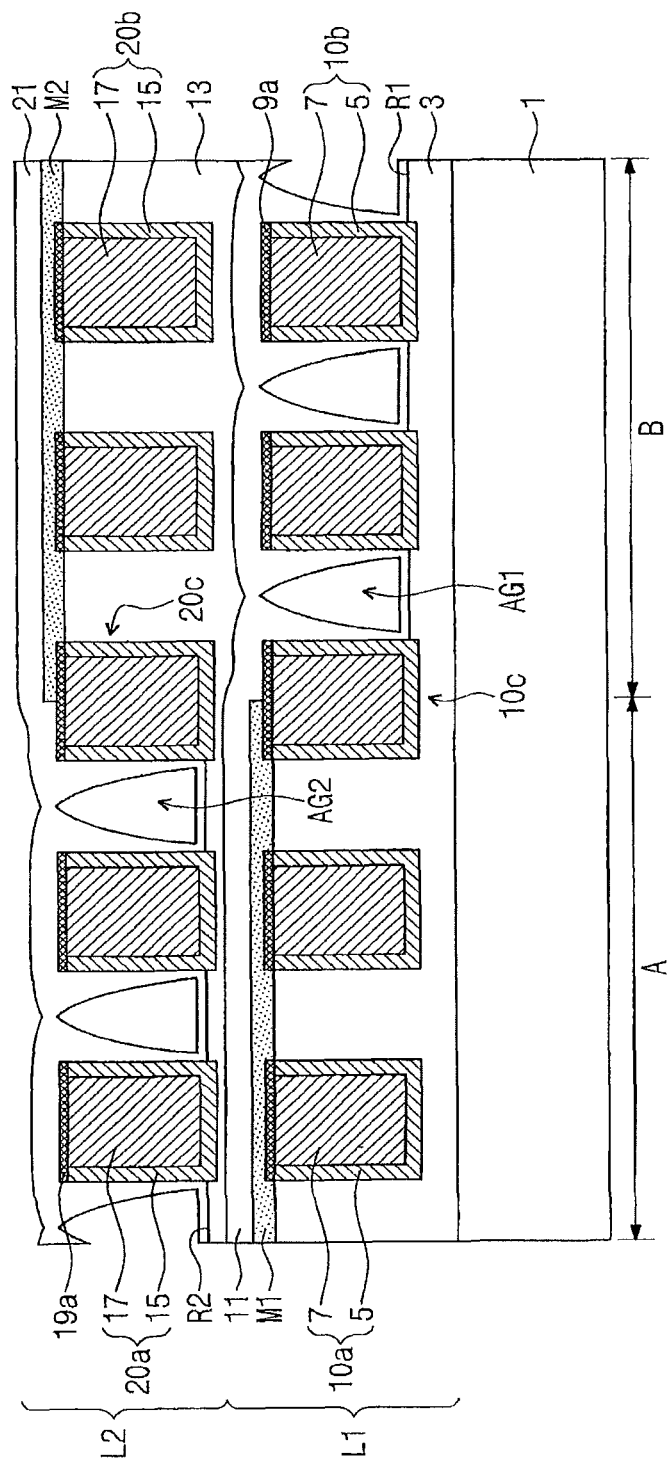

Referring to FIG. 10, a second insulating diffusion barrier layer 21 may be formed on the upper surface of the substrate 1. The second insulating diffusion barrier layer 21 may be formed by using a deposition method having a poor step coverage characteristic, e.g., a sputtering process or a physical vapor deposition process. Therefore, second air gaps AG2 may be formed between adjacent ones of the twenty-first conductive patterns 20a even though the second insulating diffusion barrier layer 21 may have a uniform thickness on the second mask pattern M2. One of the second air gaps AG2 may be formed between the twenty-third conductive pattern 20c and an adjacent one of the twenty-first conductive patterns 20a. A second interconnection layer L2 may comprise the second interlayer dielectric layer 13, the twenty-first conductive patterns 20a, the twenty-second conductive patterns 20b, the twenty-third conductive pattern 20c, the second mask pattern M2, and the second air gaps AG2.

Figure 11:
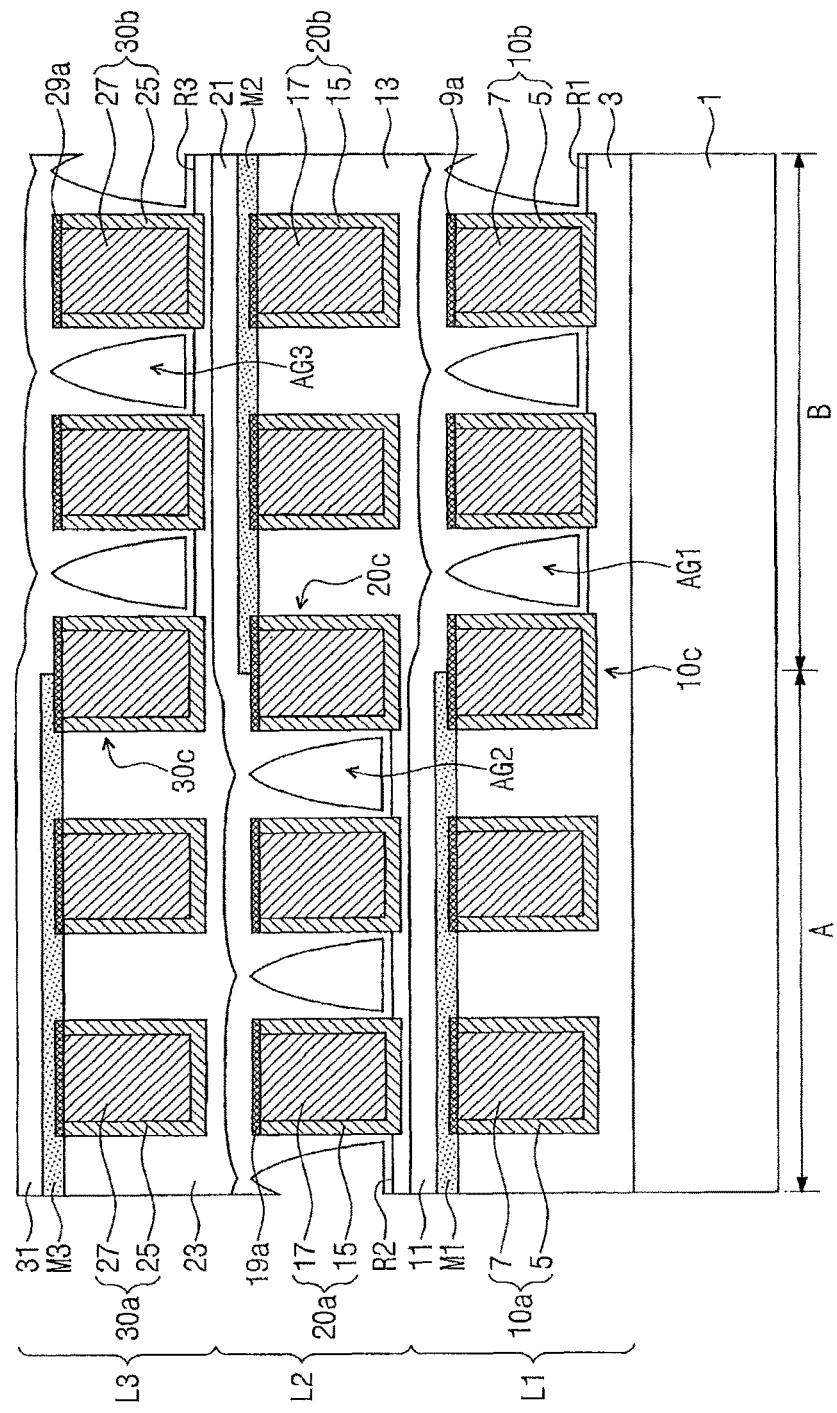

Referring to FIG. 11, a third interconnection layer L3 may be formed on the second interconnection layer L2. The third interconnection layer L3 may be formed by using substantially the same process as the method of forming the first interconnection layer L1.

Referring to FIG. 2A again, a fourth interconnection layer L4 may be formed on the third interconnection layer L3. The fourth interconnection layer L4 may be formed by using substantially the same process as the method of forming the second interconnection layer L2.

Semiconductor devices having first through fourth air gaps AG1 through AG4 arranged such that air gaps of immediately adjacent layers do not overlap by arranging the air gaps on alternating sides in successive layers has been described. In further embodiments, semiconductor devices may have other arrangements of non-overlapping air gaps. Semiconductor device having air gaps arranged alternately in each of the interconnection layers will be described. For example, the first air gaps AG1 may be formed in the first interconnection layer L1 and the second air gaps AG2 may be formed in the third interconnection layer L3. The semiconductor device may not have any air gaps in the second interconnection layer L2 or in the fourth interconnection layer L4.

Figure 12:
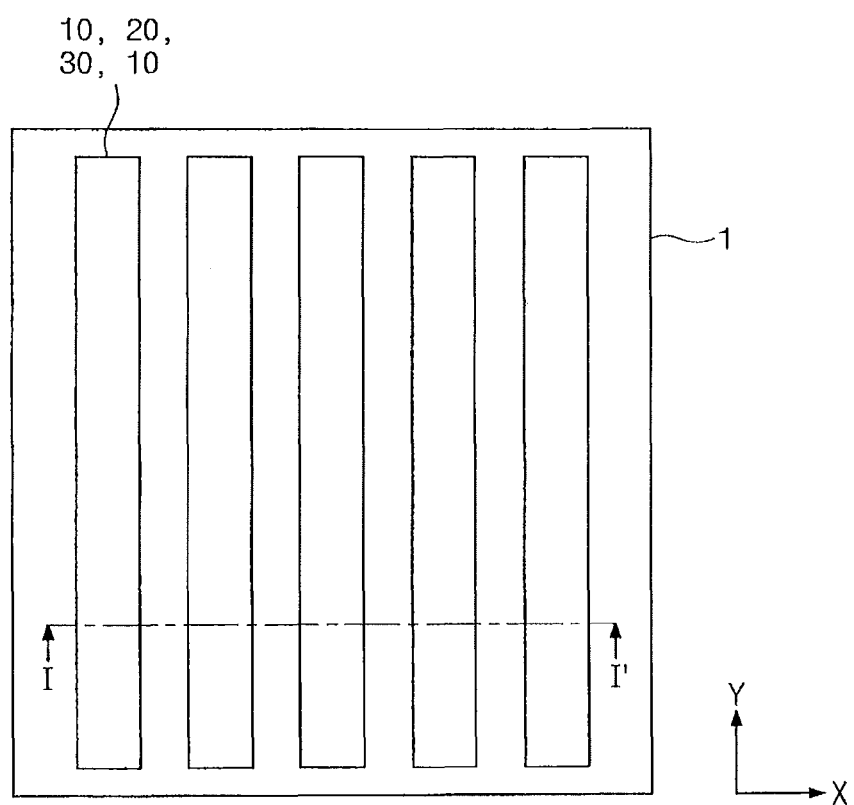
FIG. 12 is a plan view illustrating semiconductor devices according to further embodiments of the inventive concepts.

FIG. 12 is a plan view illustrating a semiconductor device according to another exemplary embodiment of the inventive concepts. FIG. 13a is a cross-sectional view corresponding to line I-I' of FIG. 12.

Figure 13:
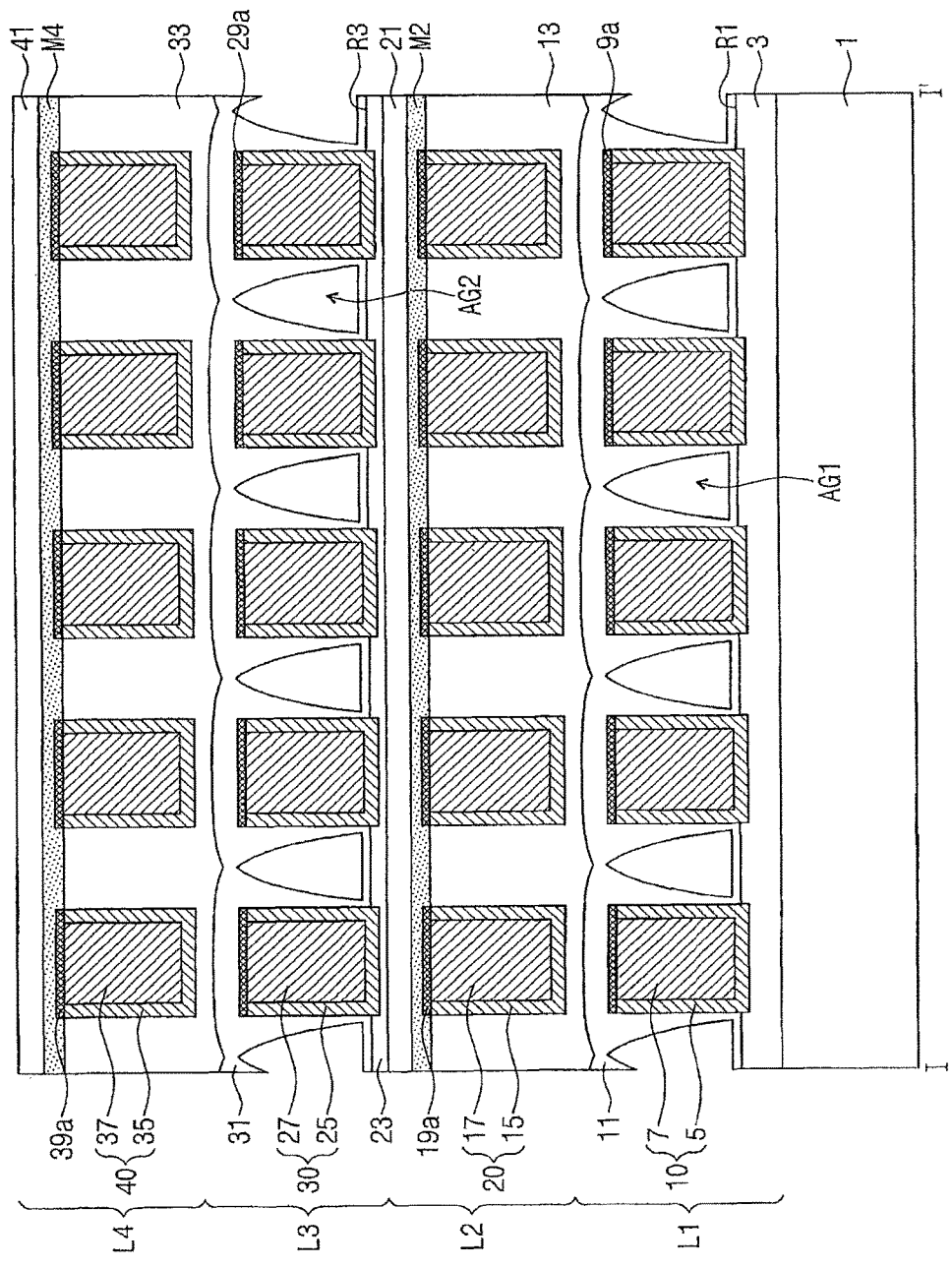
FIG. 13 is a cross-sectional view corresponding to line I-I' of FIG. 12.

Referring to FIGS. 12 and 13, a semiconductor device may comprise first through fourth interconnection layers L1, L2, L3, and L4 which are sequentially formed on a substrate 1. A plurality of first air gaps AG1 may be formed in the first interconnection layer L1 and a plurality of second air gaps AG2 may be formed in the third interconnection layer L3. There is no air gap in the second interconnection layer L2 and in the fourth interconnection layer L4. The semiconductor device shown in FIGS. 12 and 13 may have substantially the same structure as the structures shown in the second region B of FIGS. 1 and 2a, respectively.

In detail, the first interconnection layer L1 may include a first interlayer dielectric layer 3. The first interlayer dielectric layer 3 may have a first recess R1 formed therein. A plurality of first conductive patterns 10 spaced apart from each other may be disposed in the first recess R1. Upper surfaces of the first conductive patterns 10 may be covered by a first capping layer 9a and a first insulating diffusion barrier layer 11. The first insulating diffusion barrier layer 11 may define first air gaps AG1 between adjacent ones of the first conductive patterns 10.

The second interconnection layer L2 may include a second interlayer dielectric layer 13 covering the first interconnection layer L1. A plurality of second conductive patterns 20 may be disposed in the second interlayer dielectric layer 13. There are no air gaps between the second conductive patterns 20, i.e., the second interlayer dielectric layer 13 may substantially fill spaces between the second conductive patterns 20. Upper surfaces of the second conductive patterns 20 may be covered by a second capping layer 19a. Upper surfaces of the second conductive patterns 20 and the second interlayer dielectric layer 13 may be covered by a second mask pattern M2. A second insulating diffusion barrier layer 21 may be disposed on the second mask pattern M2. In some embodiments, the second mask pattern M2 and the second insulating diffusion barrier layer 21 may be omitted.

The third interconnection layer L3 may include a third interlayer dielectric layer 23 covering the second interconnection layer L2. The third interlayer dielectric layer 23 may have a third recess R3 formed therein. A plurality of third conductive patterns 30 spaced apart from each other may be disposed in the third recess R3. Upper surfaces of the third conductive patterns 30 may be covered by a third capping layer 29a and a third insulating diffusion barrier layer 31. The third insulating diffusion barrier layer 31 may define second air gaps AG2 between adjacent ones the first conductive patterns 30.

The fourth interconnection layer L4 may include a fourth interlayer dielectric layer 33 covering the third interconnection layer L3. A plurality of fourth conductive patterns 40 may be disposed in the fourth interlayer dielectric layer 33. There are air gaps between the fourth conductive patterns 40, i.e., the fourth interlayer dielectric layer 33 may substantially fill the spaces between adjacent ones of the fourth conductive patterns 40. Upper surfaces of the fourth conductive patterns 40 may be covered by a fourth capping layer 39a. Upper surfaces of the fourth conductive patterns 40 and the fourth interlayer dielectric layer 33 may be covered by a fourth mask pattern M4. A fourth insulating diffusion barrier layer 41 may be disposed on the fourth mask pattern M4. In some embodiments, the fourth mask pattern M4 and the fourth insulating diffusion barrier layer 41 may be omitted.

As shown in FIG. 13, the semiconductor device may have air gaps in the first and third interconnection layers L1 and L3. However, in another exemplary embodiment, the semiconductor device may have air gaps in the second and fourth interconnection layers L2 and L4 and may lack air gaps in the first and third interconnection layers L1 and L3.

Further exemplary embodiments will be now being described. Semiconductor devices according to further embodiments may include air gaps in each interconnection layer formed in an alternating fashion.

Figure 14:
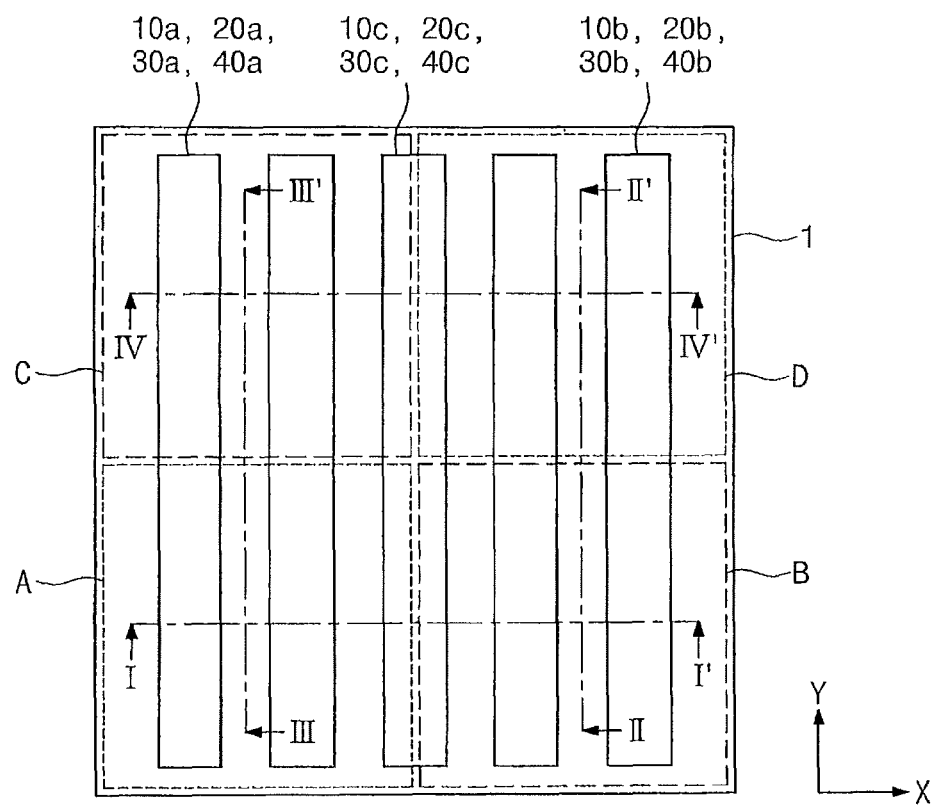
FIG. 14 is a plan view illustrating semiconductor devices according to still further embodiments of the inventive concepts.
Figure 15A:
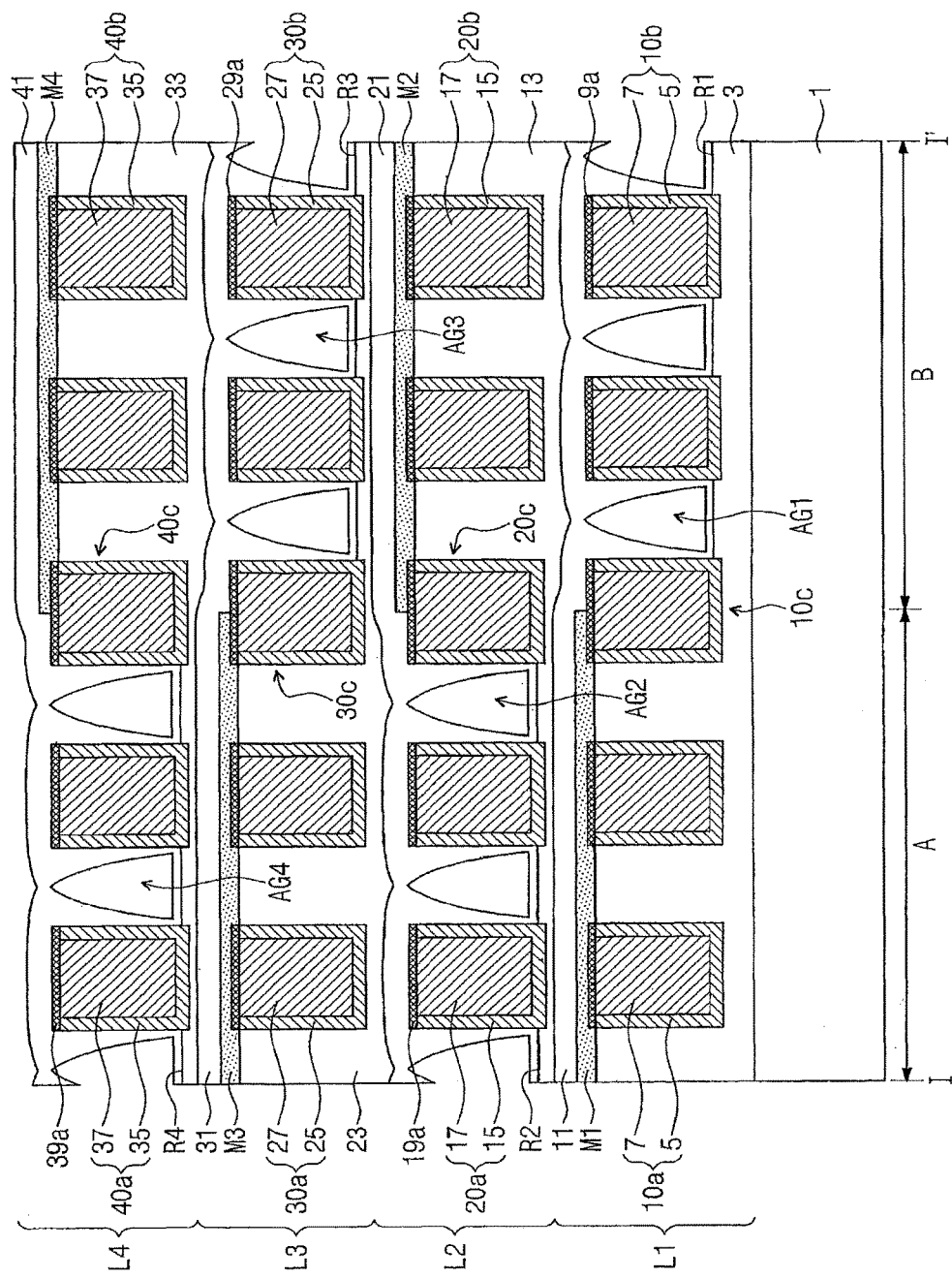
FIG. 15a is a cross-sectional view corresponding to line I-I' of FIG. 14.
Figure 15B:
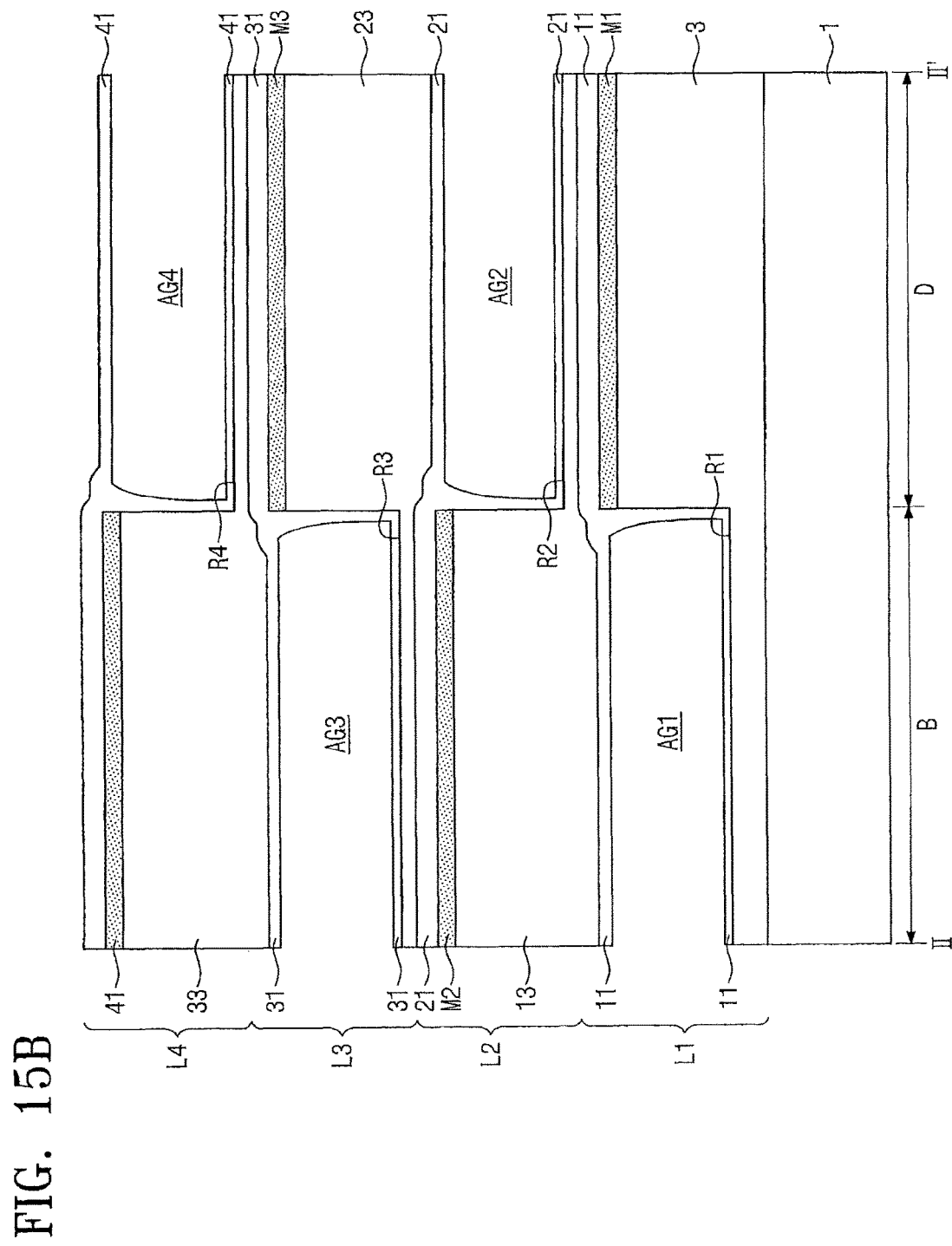
FIG. 15b is a cross-sectional view corresponding to line II-II' of FIG. 14.
Figure 15D:
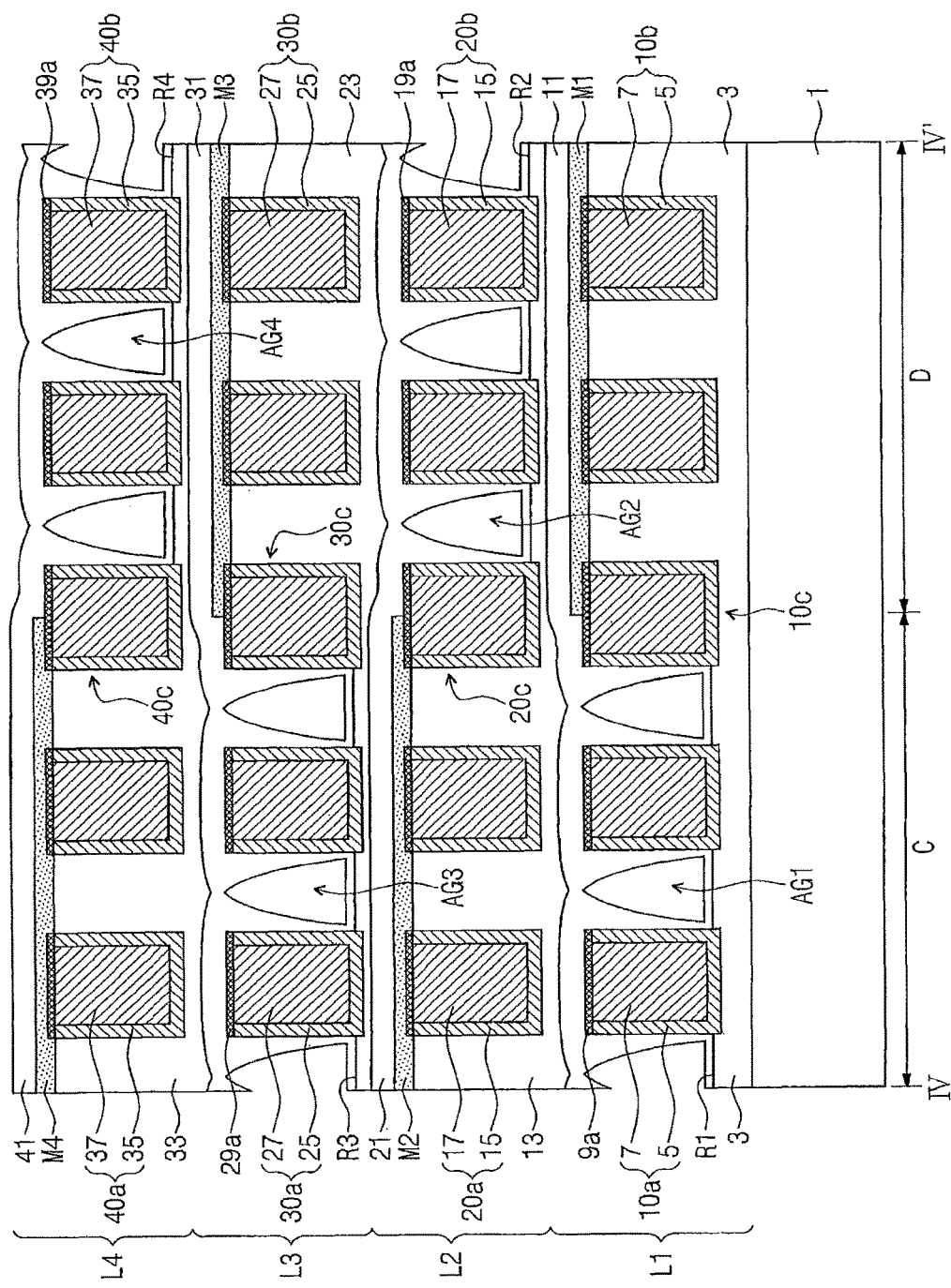
FIG. 15d is a cross-sectional view corresponding to line IV-IV' of FIG. 14.

FIG. 14 is a plan view illustrating semiconductor devices according to still another exemplary embodiment of the inventive concepts. FIG. 15a is a cross-sectional view corresponding to line I-I' of FIG. 14, FIG. 15b is a cross-sectional view corresponding to line II-II' of FIG. 14, FIG. 15c is a cross-sectional view corresponding to line of FIG. 14, and FIG. 15d is a cross-sectional view corresponding to line IV-IV' of FIG. 14.

Referring to FIGS. 14 and 15a through 15d, a substrate 1 may have first through fourth regions A, B, C, and D. The first region A may be adjacent the second region B in a first direction (X-direction) and may be adjacent the third region C in a second direction (Y-direction). The third region C may be adjacent the fourth region D in the first direction and the second region B may be adjacent the fourth region D in the second direction.

First through fourth interconnection layers L1, L2, L3, and L4 may be sequentially formed on the substrate 1. The first interconnection layer L1 may include eleventh through thirteenth conductive patterns 10a, 10b, and 10c which extend in the second direction. The eleventh through thirteenth conductive patterns 10a, 10b, and 10c may be parallel line-shaped patterns. First air gaps AG1 may be disposed between adjacent ones of the eleventh conductive patterns 10a in the second region C and between adjacent ones of the twelfth conductive patterns 10b in the third region B. However, there are no air gaps between adjacent ones of the eleventh conductive patterns 10a in the first region A and between adjacent ones of the twelfth conductive patterns 10b in the fourth region D.

Second air gaps AG2 may be disposed in the second interconnection layer L2. However, the location of the second air gaps AG2 may be different from the first air gaps AG1. In particular, the second air gaps AG2 may be disposed in the first region A and in the fourth region D.

Third air gaps AG3 may be disposed in the third interconnection layer L3. The location of the third air gaps AG3 may be similar to the first air gaps AG1. Fourth air gaps AG4 may be disposed in the fourth interconnection layer L4. The location of the fourth air gaps AG4 may be similar to the second air gaps AG2. Operations for forming the third air gaps AG3 and the fourth air gaps AG4 may be substantially the same as those described above with reference to FIGS. 1 through 11.

Figure 16:
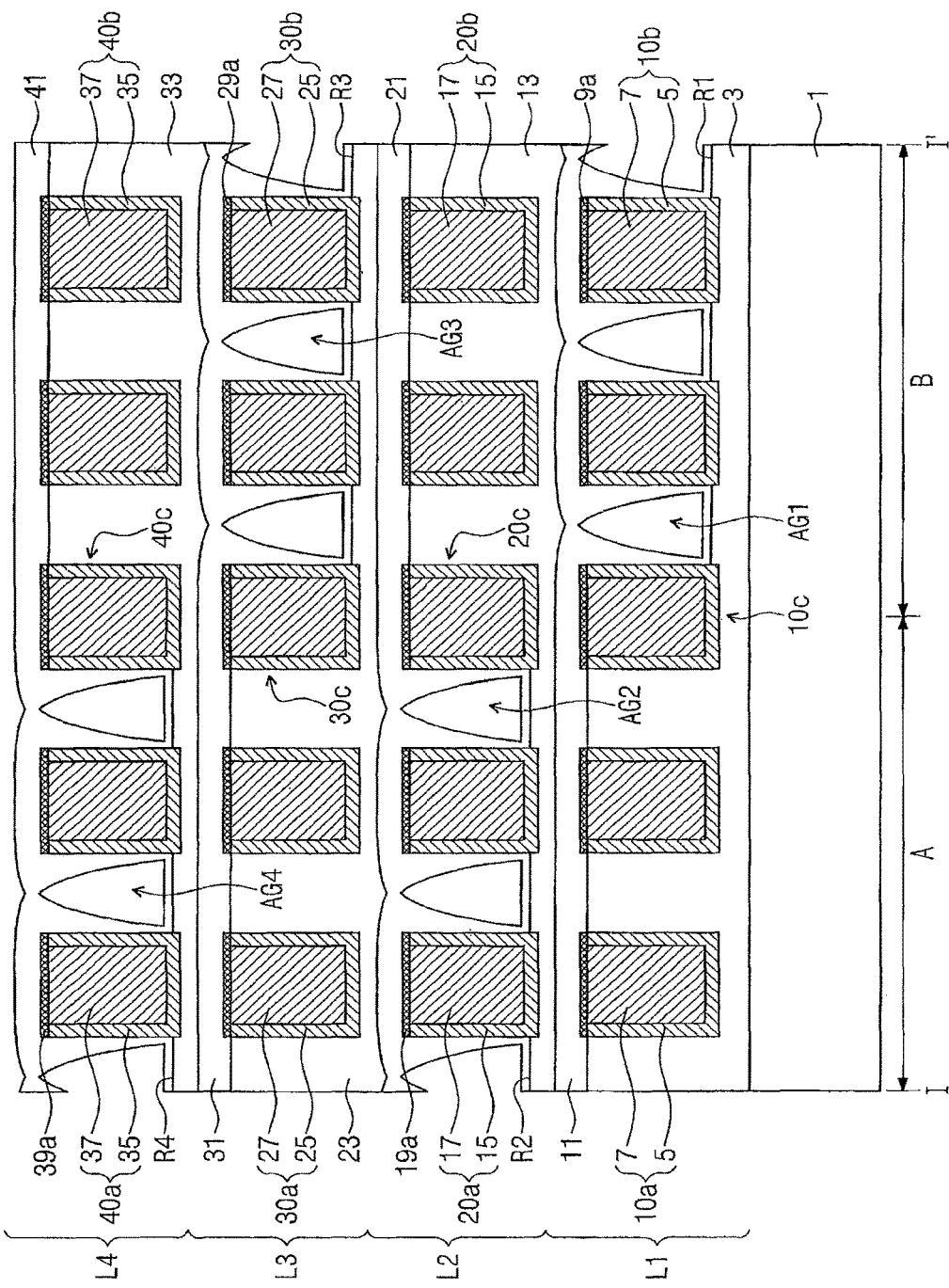
FIG. 16 is a cross-sectional view, corresponding to line I-I' of FIG. 1, illustrating semiconductor devices according to some embodiments of the inventive concepts.

FIG. 16 is a cross-sectional view, corresponding to line I-I' of FIG. 1, illustrating a semiconductor device according to still another exemplary embodiment of the inventive concepts.

Referring to FIG. 16, the semiconductor device may not include any mask patterns. The mask patterns M1, M2, M3, and M4 described above with reference to FIGS. 1-11 may be removed before forming the insulating diffusion barrier layers 11, 21, 31, and 41. The method of forming the other layers may be substantially the same as the method described in description corresponding to FIGS. 1 through 11.

Figure 17:
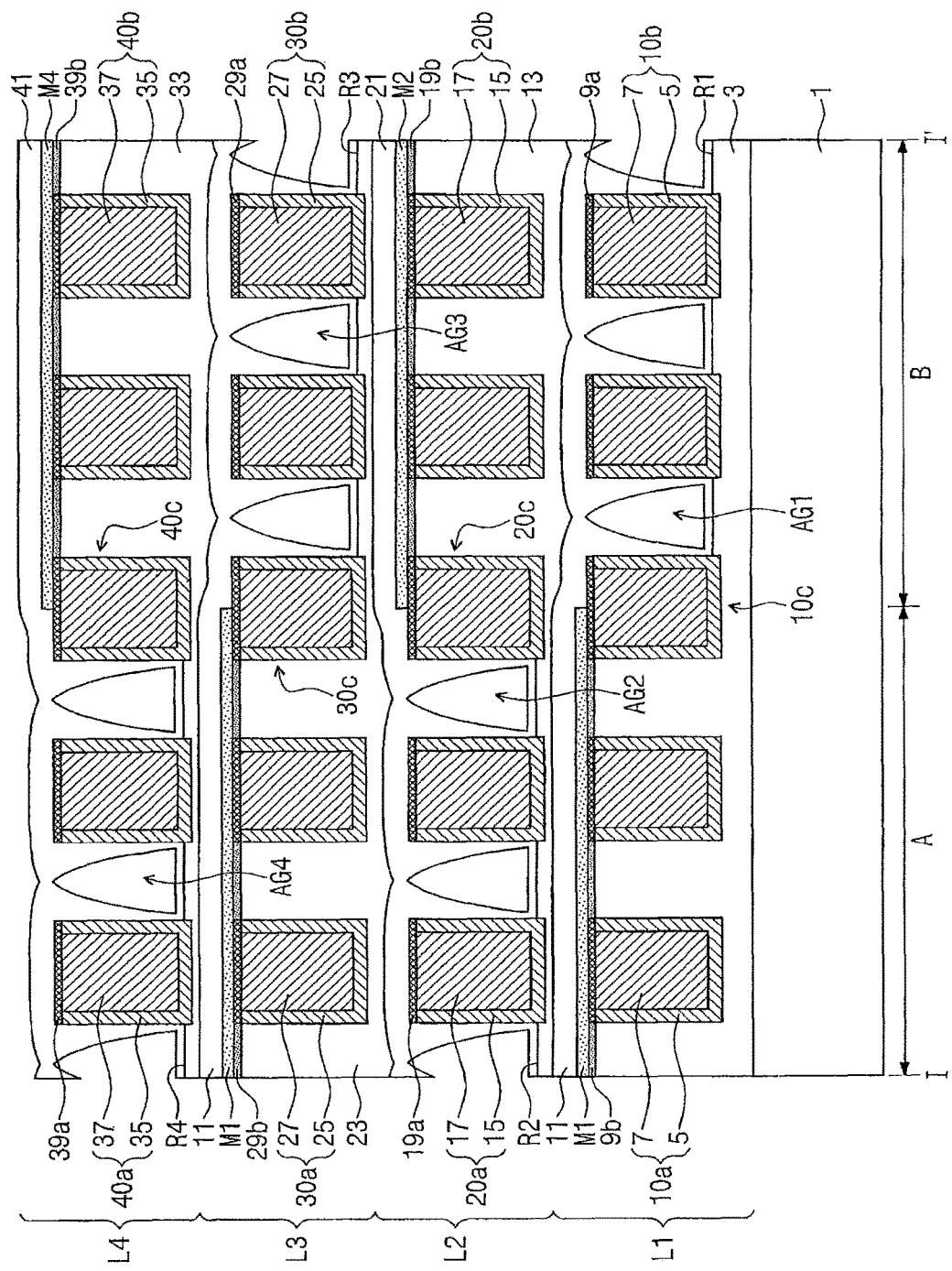
FIG. 17 is a cross-sectional view illustrating semiconductor devices according to some embodiments of the inventive concepts.

FIG. 17 is a cross-sectional view illustrating a semiconductor device according to still further embodiments of the inventive concepts. Referring to FIG. 17, a semiconductor device may include a fifth through eighth capping layers 9b, 19b, 29b, and 39b between mask patterns (M1, M2, M3, and M4) and interlayer dielectric layers (3, 13, 23, and 33) in interconnection layers L1, L2, L3, and L4, respectively. The fifth through eighth capping layers 9b, 19b, 29b, and 39b may include metal oxynitride layers, for example, aluminum oxynitride layers. The fifth through eighth capping layers 9b, 19b, 29b, and 39b may be formed simultaneously when the first through fourth capping layers 9a, 19a, 29a, and 39a are formed, respectively.

Figure 18:
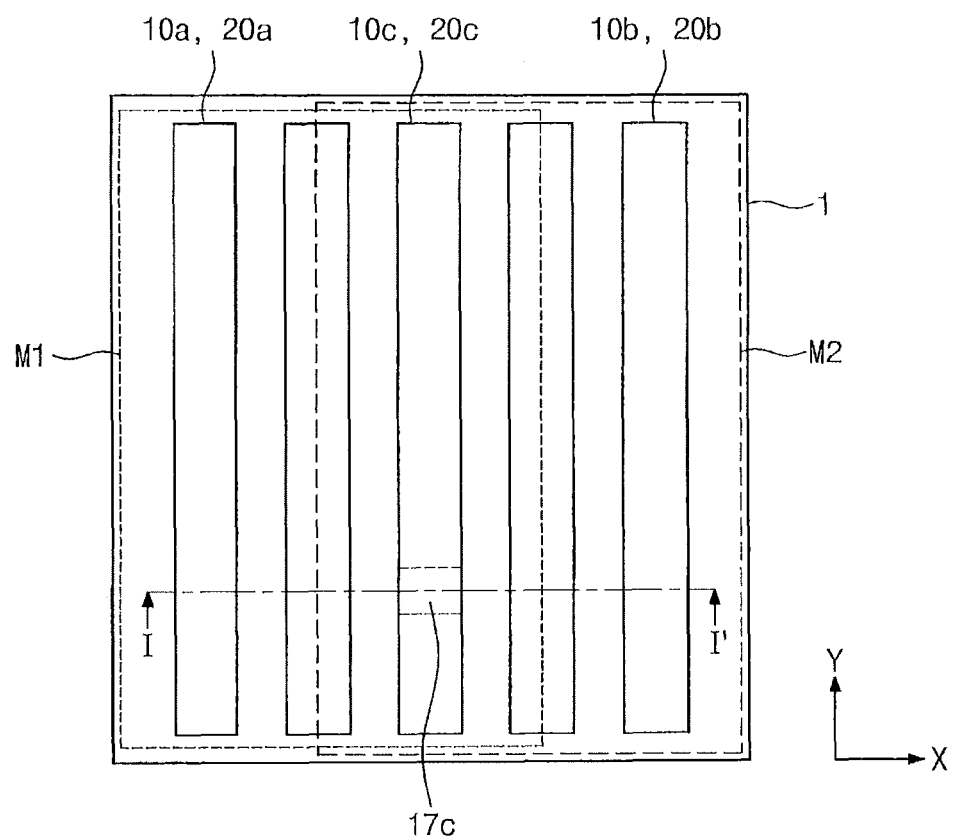
FIG. 18 is a plan view illustrating semiconductor devices according to still further embodiments of the inventive concepts.
Figure 19:
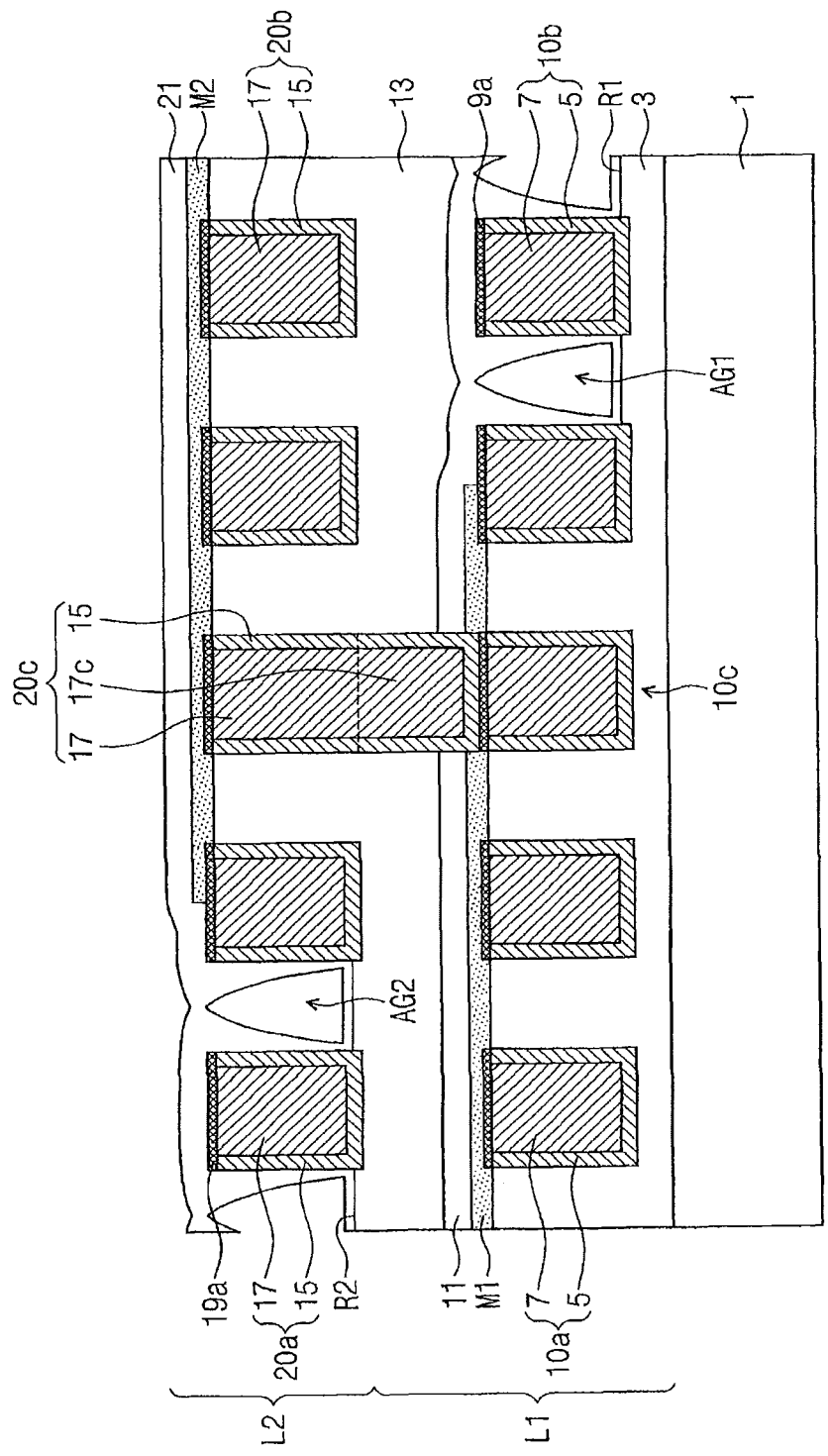
FIG. 19 is a cross-sectional view corresponding to line I-I' of FIG. 18.

FIG. 18 is a plan view illustrating a semiconductor device according to further embodiments of the inventive concepts. FIG. 19 is a cross-sectional view corresponding to line I-I' of FIG. 18.

Referring to FIGS. 18 and 19, a first interconnection layer L1 and a second interconnection layer L2 may be sequentially formed on a substrate 1. The first interconnection layer L1 may include a first interlayer dielectric layer 3 having a first recess R1 formed therein. Eleventh conductive patterns 10a may be disposed in the first interlayer dielectric layer 3 and twelfth conductive patterns 10b may be disposed in the first recess R1. A thirteenth conductive pattern 10c may be disposed at a boundary between the eleventh conductive patterns 10a and the twelfth conductive patterns 10b. Upper surfaces of the eleventh conductive patterns 10a and a portion of an upper surface of the thirteenth conductive pattern 10c may be covered by a first mask pattern M1. The first mask pattern M1 may be covered by a first insulating diffusion barrier layer 11. The first insulating diffusion barrier layer 11 may be formed in gaps between adjacent ones of the twelfth conductive patterns 10b and may define first air gaps AG1.

The second interconnection layer L2 may include a second interlayer dielectric layer 13 covering the first interconnection layer L1. The second interlayer dielectric layer 13 may have a second recess R2 defined therein on an opposite side of substrate 1 than the first recess R1. Twenty-first conductive patterns 20a may be disposed in the second recess R2. Twenty-second conductive patterns 20b may be formed in the second interlayer dielectric layer 13. A twenty-third conductive pattern 20c may be disposed at a boundary between the twenty-first conductive patterns 20a and the twenty-second conductive patterns 20b. Each of the twenty-third conductive patterns 20c extend in a direction (Y-direction) and may include a second wiring line 17, a conductive plug 17c, and a second metal diffusion barrier layer 15. The conductive plug 17c may extend from a bottom of the second wiring line 17 to the thirteenth conductive pattern 10c. The conductive plug 17c may be a via plug. Upper surfaces of the twenty-second conductive patterns 20b and the twenty-third conductive pattern 20c may be covered by a second mask pattern M2. The second mask pattern M2 may overlap the conductive plug 17c. A second insulating diffusion barrier layer 21 may be disposed on the second mask pattern M2. The second insulating diffusion barrier layer 21 may cover upper surfaces of the twenty-first conductive patterns 20a and sidewalls thereof. Second air gaps AG2 may be disposed between adjacent ones of the twenty-first conductive patterns 20a.

A sidewall of the thirteenth conductive pattern 10c may contact the first interlayer dielectric layer 3 and be positioned apart from the first air gaps AG1. A sidewall of the twenty-third conductive pattern 20c may contact to the second interlayer dielectric layer 13 and be positioned apart from the first air gaps AG1. Operations for forming the other layers may be substantially the same as those described above with reference to FIGS. 1 through 11.

Figure 20:
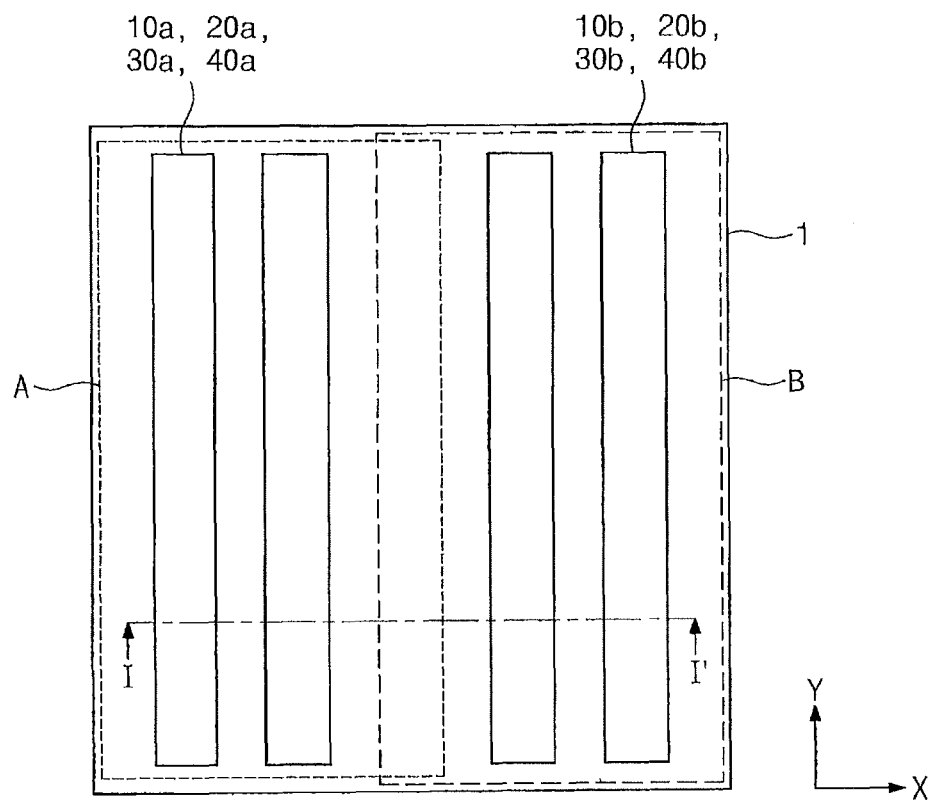
FIG. 20 is a plan view illustrating semiconductor devices according to additional embodiments of the inventive concepts.
Figure 21:
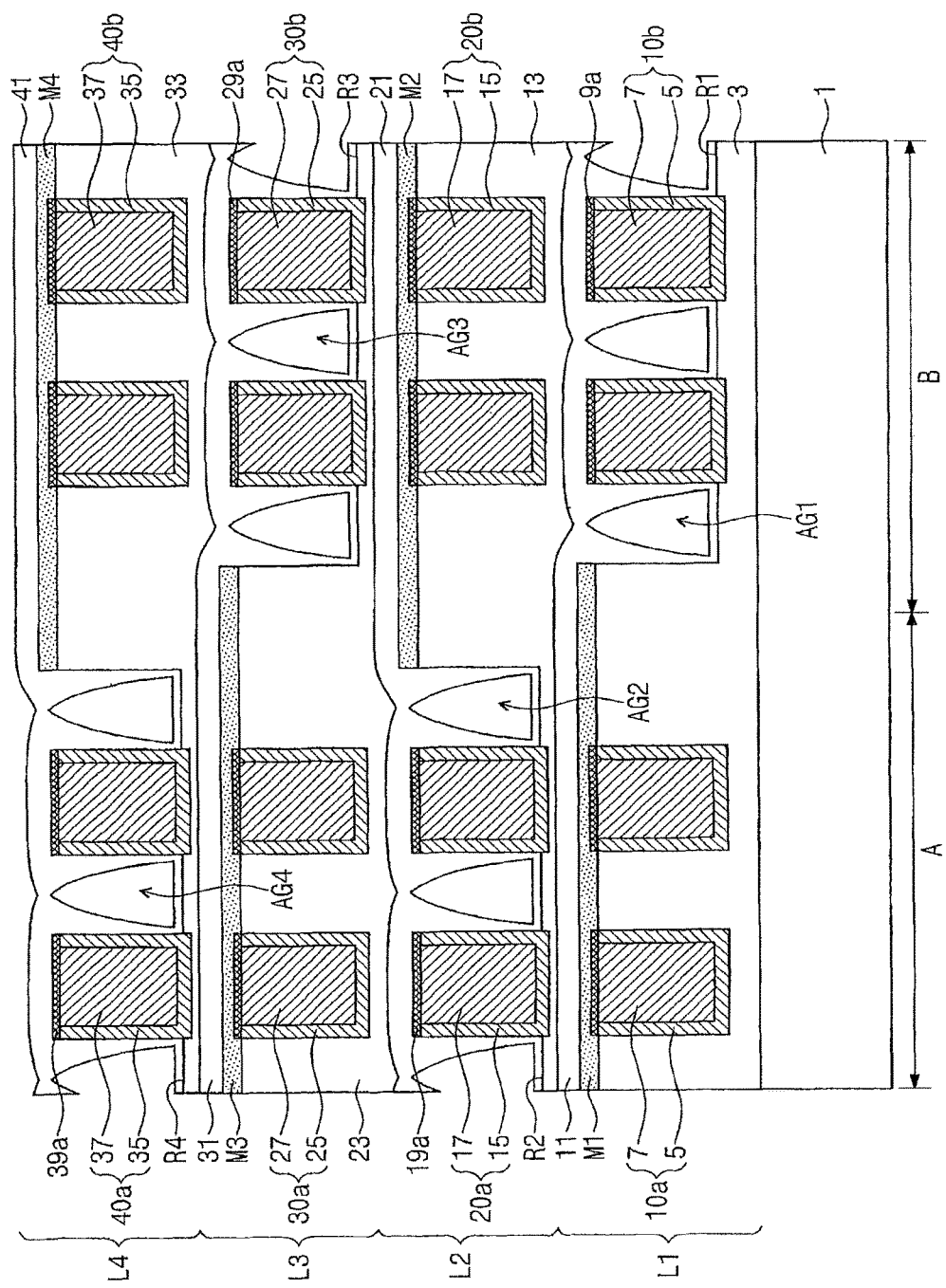
FIG. 21 is a cross-sectional view corresponding to line I-I' of FIG. 20.

FIG. 20 is a plan view illustrating a semiconductor device according to further embodiments of the inventive concepts. FIG. 21 is a cross-sectional view corresponding to line I-I' of FIG. 20.

Referring to FIGS. 20 and 21, the semiconductor device may be similar to the device illustrated in FIGS. 1 and 2A-C, but may not have the first through fourth conductive patterns 10c, 20c, 30c, and 40c at a boundary of the first region A and the second region B provided in the device illustrated in FIGS. 1 and 2A-2C. Interlayer dielectric layers 3 through 33 and mask patterns MI through M4 may be alternately formed at a boundary between a first region A and a second region B. The interlayer dielectric layers 3 through 33 and the mask patterns M1 through M4 may perform as a support at the boundary. Operations for forming the device of FIGS. 20 and 21 may be substantially similar to those described above with reference to FIGS. 1 through 11.

Figure 22:
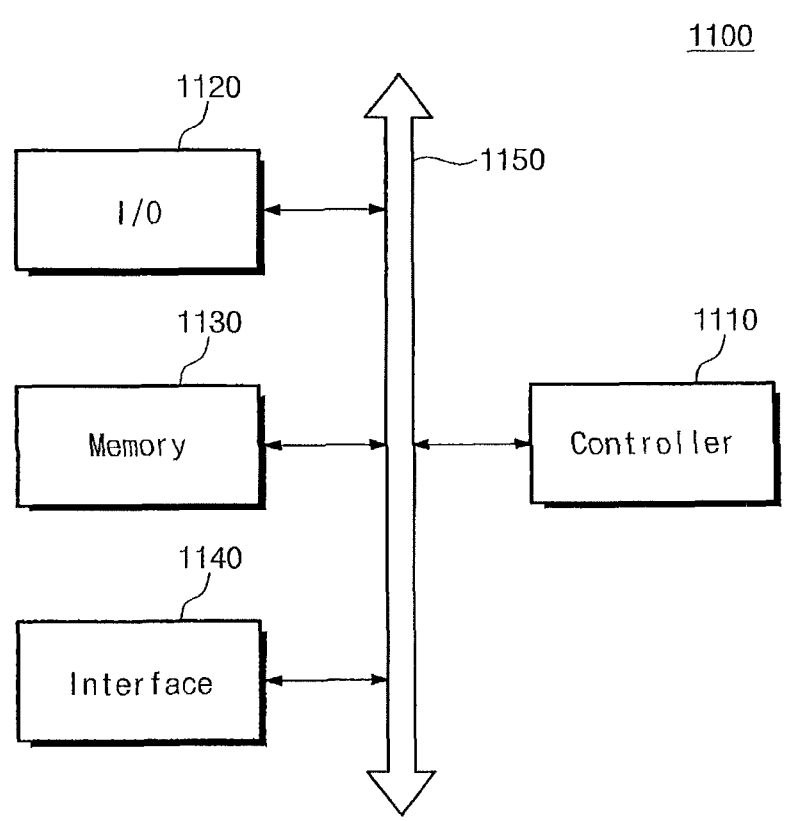
FIG. 22 is a block diagram of electronic systems including semiconductor devices according to some embodiments of the inventive concepts.

FIG. 22 is a block diagram of an electronic system including a semiconductor device according to an exemplary embodiment of the inventive concepts. Referring to FIG. 22, the system 1100 may comprise a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a path over which data can be moved between system elements.

The controller 1110 may comprise a microprocessor, a digital signal processor, a microcontroller, or a similar device that can control an executive program. The input/output device 1120 may comprise a keypad, a keyboard, or a display. The memory device 1130 may not only save codes or data for executing the controller 1110 but also save data executed by the controller 1110.

The system 1100 may be applied to a product that can transport information, e.g., a PDA (personal digital assistant), a portable computer, a web tablet, a wireless phone, a mobile phone, a digital music player, or a memory card.

The memory device 1130 may comprise a semiconductor device, which has a non-volatile memory device according to an example embodiment of the inventive concepts.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A semiconductor device comprising:
   a substrate;
   an interlayer dielectric layer on the substrate;
   first, second and third conductive lines that are disposed in series in the interlayer dielectric layer; and
   an air gap provided in a space between the first conductive line and the second conductive line.

2. The semiconductor device of claim 1, wherein the interlayer dielectric layer completely fills a space between the second conductive line and the third conductive line.

3. The semiconductor device of claim 2, wherein no air gap is provided in a space between the second conductive line and the third conductive line.

4. The semiconductor device of claim 3, further comprising:
a mask pattern fully overlapping the third conductive line and partially overlapping the second conductive line.

5. The semiconductor device of claim 1, wherein a bottom of the air gap is higher than a bottom of the first conductive line.

6. A semiconductor device comprising:
a substrate;
an interlayer dielectric layer on the substrate;
first, second, third and fourth lower conductive lines that are disposed in series in the interlayer dielectric layer;
an upper conductive line on the third lower conductive line;
a conductive plug extending from the upper conductive line to the third lower conductive line; and
an air gap provided in a space between the first lower conductive line and the second lower conductive line,
wherein the interlayer dielectric layer completely fills spaces between the second lower conductive line and the third lower conductive line and between the third lower conductive line and the fourth lower conductive line.

7. The semiconductor device of claim 6, wherein no air gap is provided in spaces between the second lower conductive line and the third lower conductive line and between the third lower conductive line and the fourth lower conductive line.

8. The semiconductor device of claim 6, wherein a bottom of the air gap is higher than a bottom of the first lower conductive line.

9. A semiconductor device comprising:
a substrate including a first region and a second region spaced apart from each other in a first direction;
lower conductive patterns disposed on the substrate and including first lower conductive patterns on the first region and second lower conductive patterns on the second region;
a first interlayer dielectric layer disposed between the first lower conductive patterns
a lower air gap provided in a space between the second lower conductive patterns;
a middle conductive pattern disposed on the lower conductive pattern in the second region;
upper conductive patterns including first upper conductive patterns disposed on the first lower conductive patterns and second upper conductive patterns disposed on the second lower conductive patterns; and
an upper air gap provided in a space between the second upper conductive patterns,
wherein the first interlayer dielectric layer completely fills a space between the first lower conductive patterns.

10. The semiconductor device of claim 9, wherein a bottom of the lower air gap is higher than bottoms of the second lower conductive patterns.

11. The semiconductor device of claim 9, wherein a bottom of the upper air gap is higher than bottoms of the second upper conductive patterns.

* * * * *

UNITED STATES PATENT AND TRADEMARK OFFICE
CERTIFICATE OF CORRECTION

PATENT NO. : 10,141,258 B2  
APPLICATION NO. : 15/659125  
DATED : November 27, 2018  
INVENTOR(S) : Sangho Rha et al.

Page 1 of 1

It is certified that error appears in the above-identified patent and that said Letters Patent is hereby corrected as shown below:

In the Claims

Column 16, Line 15, after "the" please add -- second --

Signed and Sealed this
Twenty-sixth Day of March, 2019

Andrei Iancu
*Director of the United States Patent and Trademark Office*